United States Patent
Kobayashi

(10) Patent No.: US 6,317,851 B1
(45) Date of Patent: Nov. 13, 2001

(54) MEMORY TEST CIRCUIT AND A SEMICONDUCTOR INTEGRATED CIRCUIT INTO WHICH THE MEMORY TEST CIRCUIT IS INCORPORATED

(75) Inventor: Yasuo Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/123,467

(22) Filed: Jul. 28, 1998

(30) Foreign Application Priority Data

Aug. 7, 1997 (JP) .................................................... 9-213519

(51) Int. Cl.$^7$ .............................. G11C 29/00; G11C 7/00; G06F 11/00
(52) U.S. Cl. .......................... 714/720; 714/738; 365/200; 365/201
(58) Field of Search ..................................... 714/743, 720, 714/719, 718, 819, 42, 54, 702, 735, 738, 739, 742, 820, 824; 365/200, 201

(56) References Cited

U.S. PATENT DOCUMENTS

| | | | |
|---|---|---|---|
| 4,380,068 | * | 4/1983 | Couasnon .............................. 714/704 |
| 4,835,774 | * | 5/1989 | Ooshima et al. ...................... 714/719 |
| 5,541,942 | * | 7/1996 | Strouss ................................. 714/720 |
| 5,673,270 | * | 9/1997 | Tsujimoto ............................. 714/718 |
| 5,706,234 | * | 1/1998 | Pilch, Jr. et al. ..................... 365/201 |
| 5,940,874 | * | 8/1999 | Fulcomer .............................. 711/217 |

FOREIGN PATENT DOCUMENTS

| | | |
|---|---|---|
| H5-74193 | 3/1993 | (JP) . |
| H5-81897 | 4/1993 | (JP) . |
| H6-223597 | 8/1994 | (JP) . |
| H7-192495 | 7/1995 | (JP) . |
| H8-83499 | 3/1996 | (JP) . |

OTHER PUBLICATIONS

"DRAM", Nikkei Microdevices, 1996, pp. 46–53 Mar. 1996 (in Japanese).

* cited by examiner

*Primary Examiner*—Christine T. Tu
(74) *Attorney, Agent, or Firm*—Sughrue, Mion, Zinn Macpeak & Seas, PLLC

(57) ABSTRACT

A memory test circuit in which time required for a memory test is reduced is disclosed. A memory test circuit according to the present invention is provided with stripe data generating means for generating stripe data composed of plural bits based upon a block address signal, means for writing the above stripe data to a predetermined address of a memory, means for reading information written to the above predetermined address of the memory and compare means for judging whether the above read information is the same as the stripe data or not. The above stripe data generating means generates stripe data in a cycle 2 in response to a first state of the above block address signal and generates stripe data in a cycle 4 in response to a second state of the block address signal.

18 Claims, 17 Drawing Sheets

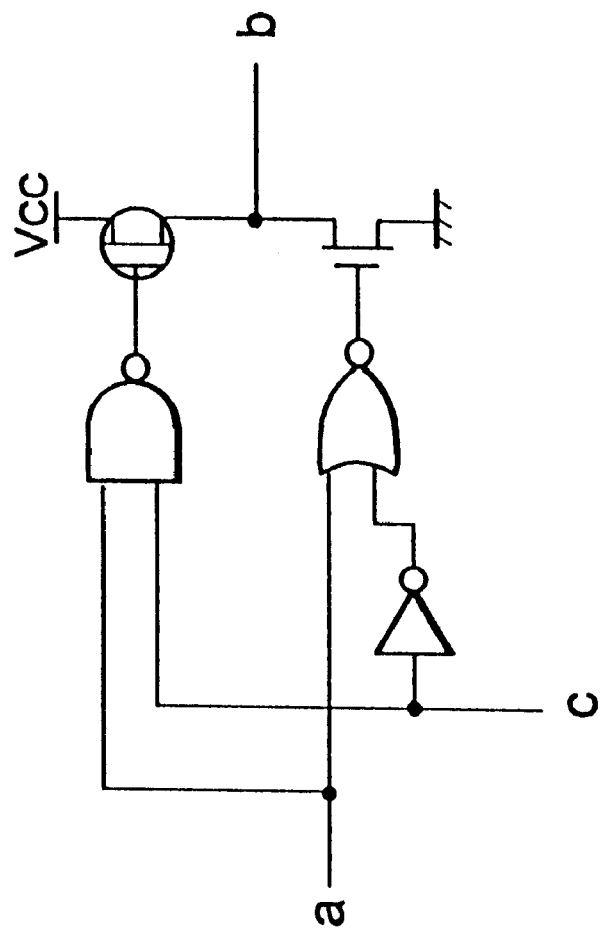
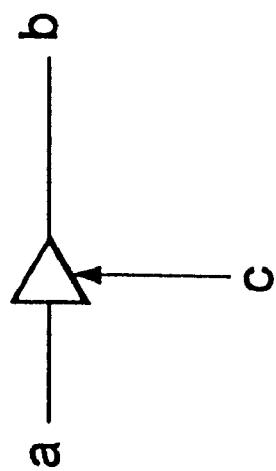
Fig.8

Fig. 12(a)

| TEST PATTERN NO. | BLOCK ADDRESS(A0-A6) | STRIPE SIGNAL PATTERN(S0-S127) | I/O1(WRITE) | I/O1(READ) |
|---|---|---|---|---|
| 1 | 0000000 | LLLLLLLLLLLLLL......LLLLLLL | L | L |
| 2 | 0000000 | LLLLLLLLLLLLLL......LLLLLLL | H | L |

Fig. 12(b)

| TEST PATTERN NO. | BLOCK ADDRESS(A0-A6) | STRIPE SIGNAL PATTERN(S0-S127) | I/O1(WRITE) | I/O1(READ) |
|---|---|---|---|---|
| 1 | 0000000 | LLLLLLLLLLLLLL......LLLLLLL | L | L |
| 2 | 0000000 | LLLLLLLLLLLLLL......LLLLLLL | H | H |

Fig. 12(c)

| TEST PATTERN NO. | BLOCK ADDRESS(A0-A6) | STRIPE SIGNAL PATTERN(S0-S127) | I/O1(WRITE) | I/O1(READ) |
|---|---|---|---|---|
| 1 | 0000000 | LLLLLLLLLLLLLL......LLLLLLL | L | H |
| 2 | 0000000 | LLLLLLLLLLLLLL......LLLLLLL | H | L |

| TEST PATTERN NO. | BLOCK ADDRESS(A0-A6) | STRIPE SIGNAL PATTERN(S0-S127) | I/O1(WRITE) | I/O1(READ) |
|---|---|---|---|---|
| 3 | 1000000 | LHLHLHLHLHLHLHL......LHLHLHLH | L | H |
| 4 | 0100000 | LLHHLLHHLLHHLLHHL......LLHHLLHH | L | L |
| 5 | 0010000 | LLLLHHHHLLLLHHHHL......LLLLHHHH | L | H |
| 6 | 0001000 | LLLLLLLLHHHHHHHHL......HHHHHHHH | L | L |
| 7 | 0000100 | LLLLLLLLLLLLLLLLH......HHHHHHHH | L | L |
| 8 | 0000010 | LLLLLLLLLLLLLLLLL......HHHHHHHH | L | L |
| 9 | 0000001 | LLLLLLLLLLLLLLLLL......HHHHHHHH | L | L |

Fig. 13

| TEST PATTERN NO. | BLOCK ADDRESS(A0-A9) | STRIPE SIGNAL PATTERN(S0-S1023) | I/O1(WRITE) | I/O1(READ) |
|---|---|---|---|---|
| 3 | 1000000000 | LHLHLHLHLHLHL......LHLHLHLH | L | H |
| 4 | 0100000000 | LLHHLLHHLLHHLLHH......LLHHLLHH | L | L |
| 5 | 0010000000 | LLLLHHHHLLLLHHHH......LLLLHHHH | L | H |
| 6 | 0001000000 | LLLLLLLLHHHHHHHH......HHHHHHHH | L | L |
| 7 | 0000100000 | LLLLLLLLLLLLLLLLL......HHHHHHHH | L | L |
| 8 | 0000010000 | LLLLLLLLLLLLLLLL......HHHHHHHH | L | L |
| 9 | 0000001000 | LLLLLLLLLLLLLLLL......HHHHHHHH | L | L |
| 10 | 0000000100 | LLLLLLLLLLLLLLLLH......HHHHHHHH | L | L |
| 11 | 0000000010 | LLLLLLLLLLLLLLLL......HHHHHHHH | L | L |
| 12 | 0000000001 | LLLLLLLLLLLLLLLL......HHHHHHHH | L | L |

Fig. 17

MEMORY TEST CIRCUIT AND A SEMICONDUCTOR INTEGRATED CIRCUIT INTO WHICH THE MEMORY TEST CIRCUIT IS INCORPORATED

BACKGROUND OF THE INVENTION

1. Field of the Invention

The present invention relates to a memory test circuit and a semiconductor integrated circuit into which the memory test circuit is incorporated, and more particularly to a memory test circuit suitable for being built in a hybrid integrated circuit of a microprocessing unit (MPU) and a memory and the hybrid IC of MPU and the memory including the memory test circuit.

2. Description of the Related Art

As semiconductor technology makes progress, the performance of a semiconductor integrated circuit is enhanced year by year and the operational frequency of a microprocessing unit (MPU) currently reaches several hundreds MHz. However, the operational frequency of a bus between MPU and a memory LSI is as low as scores MHz because of restriction such as the delay time of wiring on a printed board. Therefore, when an MPU chip and a memory LSI chip are connected via wiring on a printed board, the performance of MPU cannot be sufficiently utilized. To enhance data transfer rate via wiring on a printed board, a trial of widening bus width (increasing the number of buses) is also made, however, there is a limit because of difficulty in designing a printed board and the restriction of the number of pins in a package. Therefore, recently, hybrid LSI of MPU and a memory in which MPU and the memory are integrated on the same semiconductor substrate attracts attention according to pages 46–53 in the March number of Nikkei Micro Device published in 1996.

As MPU and a memory are not connected via wiring on a printed board but directly connected via the internal bus of a semiconductor chip in such hybrid LSI of MPU and the memory, the length of the bus is reduced and therefore, the operational frequency of the bus can be speed up. Bus width can be also readily widened. Therefore, the velocity performance of a system can be enhanced. Approximately scores-Mbit dynamic RAM (DRAM) is mounted on hybrid LSI of MPU and a memory which is recently disclosed. It is conceivable that as semiconductor miniaturizing technology makes progress, the capacity of a mounted memory will be greatly increased the in future.

When the capacity of a mounted memory is increased, time required for testing the memory is extended. In addition, in hybrid LSI of MPU and a memory, as generally, an internal memory cannot be directly accessed from an external device and is accessed via MPU under the control of MPU, a memory test circuit for directly outputting data on an internal bus connecting the memory and MPU to an external device without via MPU and for directly supplying data from an external device to the internal bus without via MPU is required to test the memory separately from MPU.

Therefore, it is conceivable that a device to make a memory test in such LSI in short time will be more important in the future.

SUMMARY OF THE INVENTION

Therefore, an object of the present invention is to provide a memory test circuit in which time required for a memory test is reduced.

Another object of the present invention is to provide a memory test circuit in which time required for a memory test is reduced and which can locate a failure in short time if the failure is discovered in a memory test.

Further another object of the present invention is to provide a memory test circuit suitable for mounting the same on a hybrid LSI of MPU and a memory.

Furthermore another object of the present invention is to provide hybrid LSI of MPU and a memory on which a memory test circuit in which time for a test is short is mounted.

The other object of the present invention is to provide a memory test circuit which does not require multiple terminals for a test.

A memory test circuit according to the present invention is provided with first means for writing data at one logical level to any memory cell in a semiconductor memory, second means for reading data from the above any memory cell to which the data at one logical level is written, third means for detecting whether data at the other logical level different from the above one logical level is included or not in data read by the above second means, fourth means for writing data at the above other logical level to the above any memory cell, fifth means for reading data from any memory cell to which data at the above other logical level is written, and sixth means for detecting whether data at the above one logical level is included or not in data read by the fifth means.

The memory test circuit according to the present invention is provided with stripe data generating means for generating stripe data based upon a block address signal and composed of plural bits, means for writing the above stripe data to a predetermined address of a memory, means for reading information written to the above predetermined address of the memory, and a comparison means for judging whether the above read information is equivalent to the above stripe data or not, and characterized in that the above stripe data generating means generates stripe data in which one logical level and the other logical level are alternately repeated in response to a first state of the above block address signal and generates stripe data in which one logical level which continues at least twice and the other logical level which continues at least twice are alternately repeated in response to a second state of the block address signal.

BRIEF DESCRIPTION OF THE DRAWINGS

FIG. 8 is a circuit diagram showing tristate buffers 203 and 204 shown in FIG. 7;

FIGS. 12 are tables showing the state of each signal in test patterns 1 and 2 of a memory test by the hybrid LSI of MPU and the memory 100 shown in FIG. 1;

FIG. 13 is a table showing the state of each signal in test patterns 3 to 9 of the memory test by the hybrid LSI of MPU and the memory 100 shown in FIG. 1;

FIG. 17 is a table showing the state of each signal in test patterns 3 to 12 of a memory test by the hybrid LSI of MPU and the memory 200 shown in FIG. 14;

DESCRIPTION OF THE PREFERRED EMBODIMENTS

Before a memory test circuit according to an embodiment of the present invention is described, hybrid LSI of MPU and a memory 400 including a memory test circuit in a reference example to be compared with the above memory test circuit in this embodiment will be described below, referring to FIG. 19.

Figure 19:
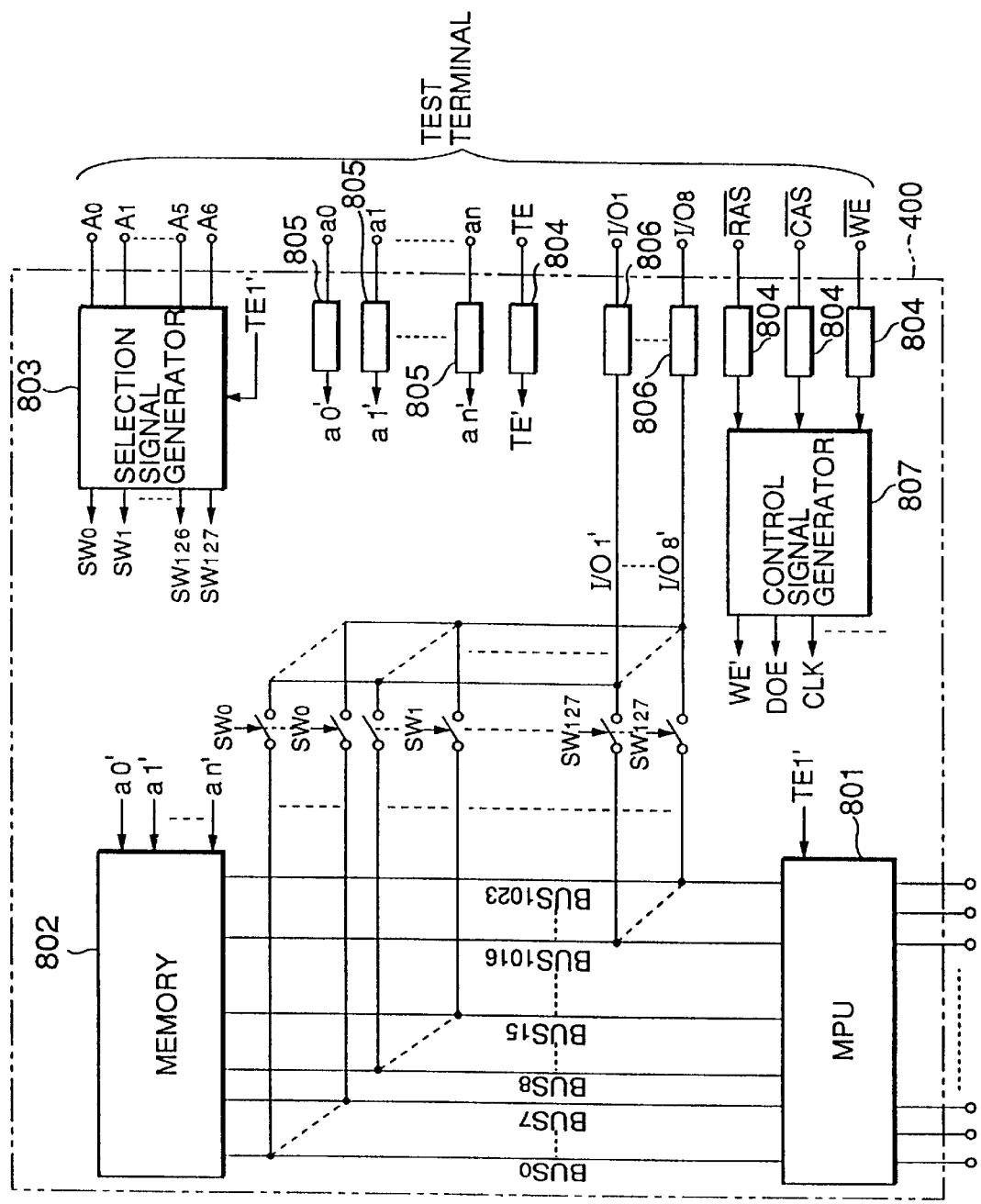
FIG. 19 is a block diagram showing hybrid LSI of MPU and a memory 400 including a memory test circuit in a reference example.

The hybrid LSI of MPU and the memory 400 shown in FIG. 19 is roughly composed of MPU 801 and a memory 802. The memory 802 is dynamic RAM (DRAM) composed of 1 M words×1024 bits (storage capacity: 1 Gbits). Data is communicated via 1024 data buses ($BUS_0$ to $BUS_{1023}$) between the memory 802 and MPU 801.

A circuit for testing the memory 802 is composed of a selection signal generator 803, four input buffer circuits 804 for respective input signals of a test enable input signal TE (Test Enable), a row address strobe RAS (Row Address Strobe), a column address strobe CAS (Column Address Strobe) and a write enable signal WE (Write Enable), (n+1) input buffer circuits 805 respectively provided with a register for address input signals ao to an, eight input-output buffer circuits 806 for $I/O_1$ to $I/O_8$, a control signal generator 807 and 1024 (128×8) switching circuits between BUS and I/O' respectively controlled by selection signals $SW_0$ to $SW_{127}$. "/RAS", "/CAS" and "/WE" shall respectively denote a RAS bar, a CAS bar and a WE bar. Hereinafter, "/" before a signal name or a terminal name shall be used in the same meaning.

The test enable input signal TE is a signal for setting a memory test mode. The hybrid LSI of MPU and the memory 400 is in a memory test mode if TE is at a high level ("H") and is in a normal operation mode if TE is at a low level ("L"). When TE is at a high level, a bus driving buffer of MPU 801 is at high impedance and the selection signal generator 803 is activated. The selection signal generator 803 is a decoder for receiving block address input signals $A_0$ to $A_6$ and decoding them. The result of the above decoding is outputted as switching signals $SW_0$ to $SW_{127}$.

The switching signals $SW_0$ to $SW_{127}$ generated by the selection signal generator 803 are supplied to the respective corresponding switching circuits between BUS and I/O' and control the continuity or discontinuity of these switching circuits between BUS and I/O'. That is, these switching signals $SW_0$ to $SW_{127}$ control the switching circuits between BUS and I/O' and determine which group of 1024 data buses $BUS_0$ to $BUS_{1023}$ which are grouped into 128 by eight is to be connected to $I/O_1'$ to $I/O_8'$. That is, when a predetermined switching signal $SW_i$ determined depending upon the block address input signals $A_0$ to $A_6$ is at a high level, only eight of 1024 switching circuits between BUS and I/O' are turned on. For example, when $SW_1$ is at a high level, the total eight switching circuits between $BUS_8$ and $I/O_1'$, between $BUS_9$ and $I/O_2'$, . . . and between $BUS_{15}$ and $I/O_8'$ are turned on.

A /RAS input signal, a /CAS input signal and a /WE input signal are respectively supplied to a control signal generator 807 via the respective input buffer circuit 804. The control signal generator 807 receives these input signals and generates a write control signal WE', a data output activating signal DOE, an internal clock signal CLK and others.

The address input signals $a_0$ to $a_n$ are inputted to a decoder (its concrete circuit is omitted) provided to the memory 802 via input buffer circuit 805. As the memory 802 includes a memory cell array composed of 1 M words×1024 bits (total storage capacity: 1 Gbits), one word of the 1 M words is selected by address buffer signals $a_0'$ to $a_n'$. As 1 M is equivalent to $2^{20}$, 20 address input signals are required. Therefore, the value of n in $a^n$ is 19.

Eight data input-output signals $I/O_1$ to $I/O_8$ are inputted/outputted to/from the I/O buses $I/O_1'$ to $I/O_8'$ via data input-output buffer 806.

A memory test for the memory 802 in such hybrid LSI of MPU and the memory 400 is executed as follows:

First, the test enable input signal TE is turned to a high level and the block address input signals $A_0$ to $A_6$ are inputted. Hereby, a predetermined $SW_i$ is turned to a high level and only eight data buses $BUS_{8i}$ to $BUS_{8i+7}$ (i=0, 1, . . . , 127) of 1024 data buses $BUS_0$ to $BUS_{1023}$ are connected to the I/O buses $I/O_1'$ to $I/O_8'$. In this state, each of the input signals $a_0$ to $a_n$ of all '0' and all '1' is sequentially supplied with /RAS, /CAS and /WE supplied at predetermined timing and hereby, a predetermined test pattern is sequentially given to $I/O_1$ to $I/O_8$ with the corresponding eight memory cells sequentially accessed.

Test patterns are as follows:

(1) Data '0' is sequentially written to one of 128 memory cells selected based upon respective block address input signals $A_0$ to $A_6$ in the memory 802.

(2) Next, after data '0' written to the memory cells is read, data '1' is written to the same memory cells. This operation is sequentially executed to any of 128 memory cells selected based upon the block address input signals $A_0$ to $A_6$ in the memory 802.

(3) Next, after data '1' written to the memory cells is read, data '0' is written to the same memory cells. This operation is sequentially executed to any of 128 memory cells selected based upon the block address input signals $A_0$ to $A_6$ in the memory 802.

(4) Finally, data '0' written to the memory cells is sequentially read. Hereby, a test in one of 128 areas selected based upon the respective block address input signals $A_0$ to $A_6$ in the memory 802 is completed. The test of the whole memory 802 is completed by executing such a test to all the block address input signals $A_0$ to $A_6$ (by executing such a test by means of sequentially updating 0 to 127 of i).

Time required for such a memory test is calculated as follows:

First, as writing is executed once in the above test pattern (1), reading and writing are respectively executed once in the test patterns (2) and (3) and reading is executed once in the test pattern (4), writing to each memory cell is executed three times and reading from each memory cell is executed three times respectively in total. If cycle time required for the above writing or reading is 200 ns., total test time T is calculated as follows:

$$T = 200 \times 10^{-9} \times ((3_{write} + 3_{read}) \times 1048576_{WORD}) \times 128_{BLOCK} \approx 161 \text{ (second)}$$

That is, time required for testing the memory 802 built in the hybrid LSI of MPU and the memory 400 is approximately 161 seconds.

As described above, in the hybrid LSI of MPU and the memory 400, it can be judged whether a failure occurs in the memory 802 or not by a memory test for approximately 161 seconds and if a failure occurs, the address of a memory cell where the failure occurs can be located.

Next, referring to FIG. 1, hybrid LSI of MPU and a memory 100 on which a memory test circuit according to an embodiment of the present invention is mounted will be described. The same reference numeral is given to the same part as that in the hybrid LSI of MPU and the memory 400 shown in FIG. 19.

Figure 1:
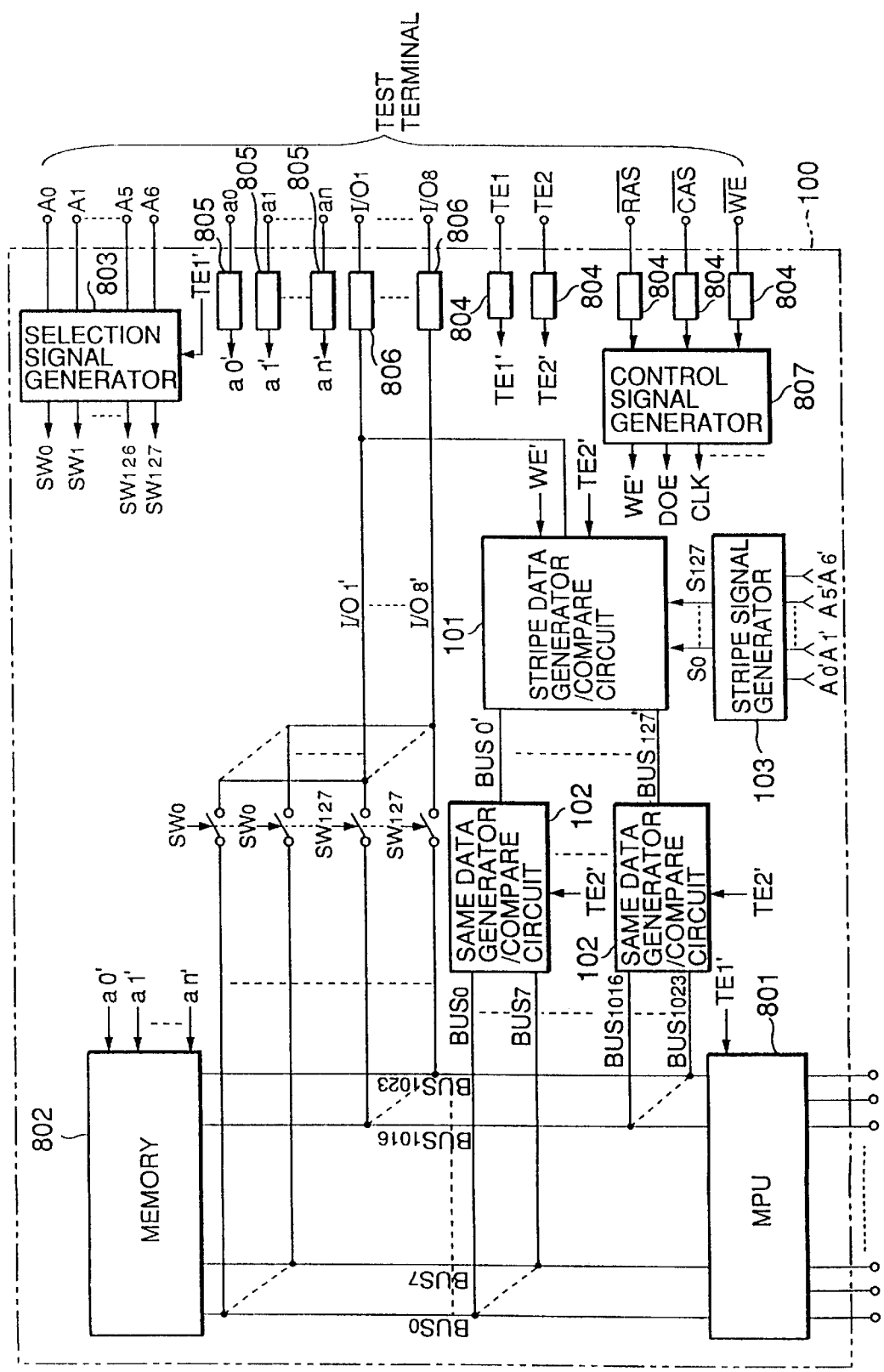
FIG. 1 is a block diagram showing hybrid LSI 100 of MPU and a memory including a memory test circuit according to an embodiment of the present invention.

The hybrid LSI of MPU and the memory 100 shown in FIG. 1 is roughly composed of MPU 801 and the memory 802 as in the hybrid LSI of MPU and the memory 400. The memory 802 is dynamic RAM (DRAM) composed of 1 M words×1024 bits (storage capacity: 1 Gbits). Data is communicated between the memory 802 and MPU 801 via 1024 data buses ($BUS_0$ to $BUS_{1023}$). It is to be noted natural that the storage capacity of the memory 802 is not limited to 1 Gbits and the number of data buses is also not limited to 1024.

A circuit for testing the memory 802, that is, a memory test circuit in this embodiment is composed of a selection signal generator 803, four input buffer circuits 804 for each input signal of a first test enable input signal TE1 (Test Enable 1), a second test enable input signal TE2 (Test Enable 2) /RAS (Row Address Strobe), /CAS (Column Address Strobe) and /WE (Write Enable), (n+1) input buffer circuits 805 respectively provided with a register for the address input signals $a_0$ to $a_n$, eight input-output buffer circuits 806 for $I/O_1$ to $I/O_8$, a control signal generator 807, 1024 (128×8) switching circuits between BUS and I/O' controlled by the selection signals $SW_0$ to $SW_{127}$, a stripe signal generator 103, a stripe data generator/compare circuit 101 and a same data generator/compare circuit 102.

As described above, the hybrid LSI of MPU and the memory 100 is different from the hybrid LSI of MPU and the memory 400 shown in FIG. 19 in that a test signal is composed of the first test enable input signal TE1 and the second test enable input signal TE2, and the stripe signal generator 103, the stripe data generator/compare circuit 101 and the same data generator/compare circuit 102 are added.

The first test enable input signal TE1 is a signal for setting a first memory test mode and if TE1 is at a high level ("H"), the hybrid LSI of MPU and the memory 100 is in a first memory test mode, that is, in an operational mode for locating a failure. In the meantime, the second test enable input signal TE2 is a signal for setting a second memory test mode and if TE1 is at a high level ("H"), the hybrid LSI of MPU and the memory 100 is in a second memory test mode, that is, in an operational mode for judging whether a failure occurs or not and locating a block address to which the address of a memory cell where the failure occurs belongs.

If TE1 and TE2 are at a low level ("L"), the hybrid LSI of MPU and the memory 100 is in a normal operation mode.

The outline of the memory test operation of the hybrid LSI of MPU and the memory 100 is as follows:

(1) First, the second test enable input signal TE2 is turned to a high level and the hybrid LSI of MPU and the memory 100 is turned to a second memory test mode. Hereby, if it is clarified that no failure occurs in the memory 802, a memory test is finished.

(2) If it is detected that a failure occurs in the memory 802, the second test enable input signal TE2 is kept at a high level, the hybrid LSI of MPU and the memory 100 is kept in a second memory test mode and a block address to which the address of a memory cell where the failure occurs belongs is located.

(3) When the block address to which the address of the memory cell where the failure occurs belongs is located, the second test enable input signal TE2 is restored to a low level ("L"), the hybrid LSI of MPU and the memory 100 is turned to a first memory test mode by turning the first test enable input signal TE1 to a high level ("H") to locate the address of a memory cell in which a failure occurs.

Also referring to the other drawings, the configuration and the memory test operation of the hybrid LSI of MPU and the memory 100 will be described in detail below.

Figure 3:
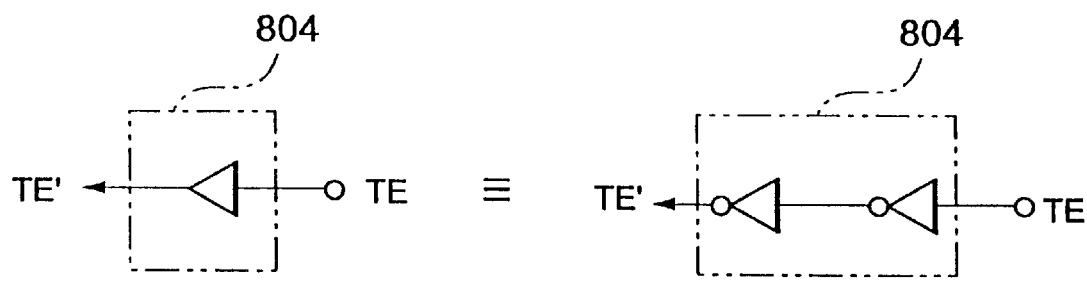
FIG. 3 is a circuit diagram showing an input buffer circuit 804 shown in FIG. 1.

First, input buffer circuits 804 which receive each of the first test enable input signal TE1, the second test enable input signal TE2, the /RAS signal, the /CAS signal and the /WE signal is constituted by the two-stage series connection of inverter circuits as shown in FIG. 3. Hereinafter, the first test enable input signal TE1 and the second test enable input signal TE2 each buffered by input buffer circuit 804 are respectively called a first internal test enable input signal TE1' and a second internal test enable input signal TE2'.

Figure 2:
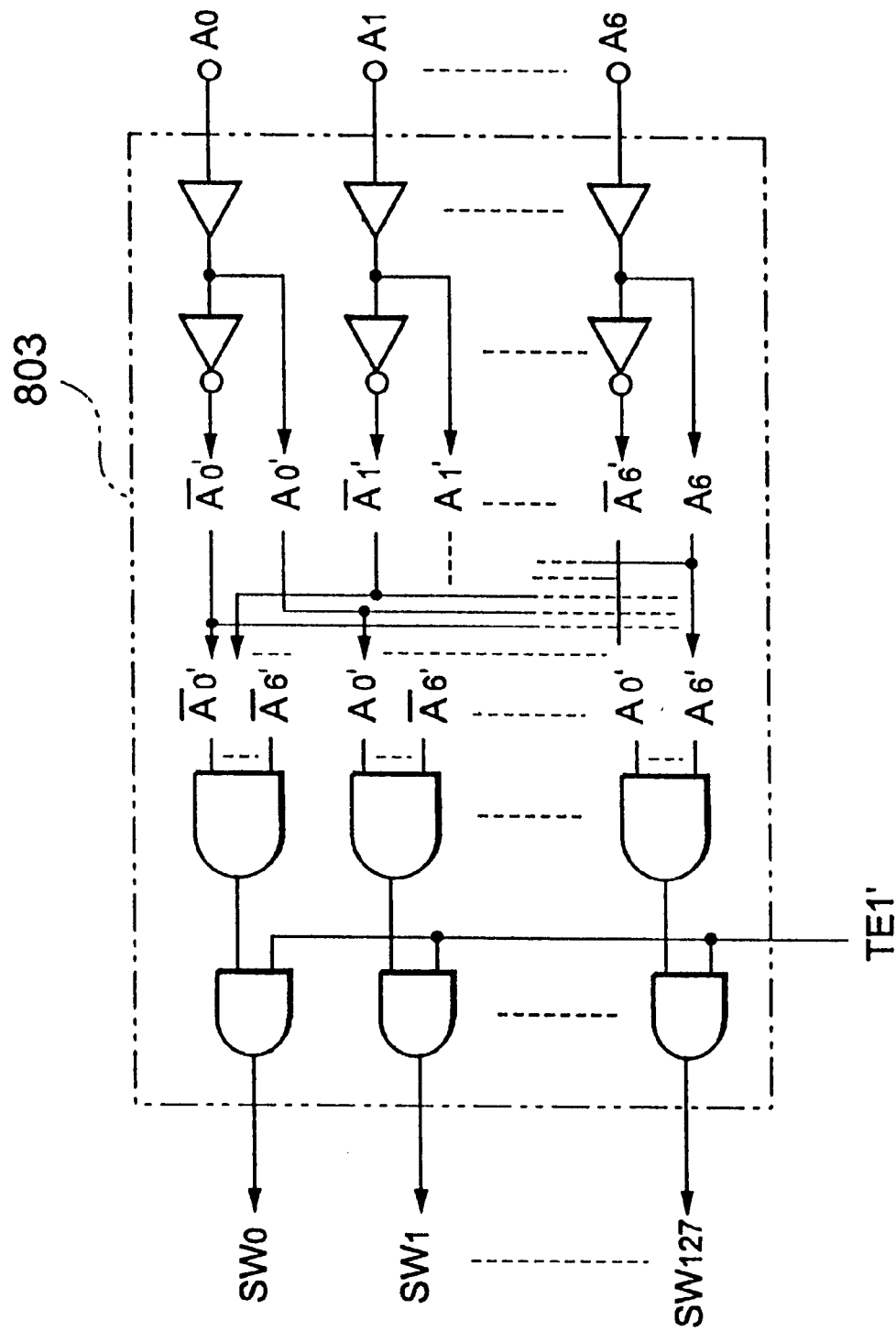
FIG. 2 is a circuit diagram showing a selection signal generator 803 shown in FIG. 1.

Next, the selection signal generator 803 is a decoder for receiving the block address input signals $A_0$ to $A_6$ and decoding them as shown in FIG. 2. That is, the selection signal generator 803 receives the coded 7-bit block address input signals $A_0$ to $A_6$ and generates signals $A_0'$ to $A_6'$ obtained by buffering these block address input signals $A_0$ to $A_6$ and signals $/A_0'$ to $/A_6'$ obtained by inverting the block address input signals $A_0$ to $A_6$. Further, the selection signal generator generates the switching signals $SW_0$ to $SW_{127}$ based upon the signals $A_0'$ to $A_6'$ and the signals $/A_0$ to $A_6$ in response to the activation of the first internal test enable input signal TE1' buffered by the input buffer circuit 804. One of the switching signals $SW_0$ to $SW_{127}$ is activated based upon the combination of the coded 7-bit block address input signals $A_0$ to $A_6$. For example, if the block address input signals $A_0$ to $A_6$ are '0000000', only the switching signal $SW_0$ of switching signals $SW_0$ to $SW_{127}$ is activated, if the block address input signals $A_0$ to $A_6$ are '1000000', only a switching signal $SW_i$ of switching signals $SW_0$ to $SW_{127}$ is activated and if the block address input signals $A_0$ to $A_6$ are '1111111', only a switching signal $SW_{127}$ of switching signals $SW_0$ to $SW_{127}$ is activated.

Switching signals $SW_0$ to $SW_{127}$ generated by the selection signal generator 803 are respectively supplied to the corresponding switching circuit between BUS and I/O' and control the continuity or the discontinuity of these switching circuits between BUS and I/O'. That is, these switching signals $SW_0$ to $SW_{127}$ control the switching circuits between BUS and I/O' and determine whether which group of 1024 data buses $BUS_0$ to $BUS_{1023}$ which are grouped into 128 by eight is to be connected to I/O buses $I/O_1'$ to $I/O_8'$. That is, only eight of 1024 switching circuits between BUS and I/O' are turned on by turning a predetermined switching signal SW$_i$ determined depending on the block address input signals A$_0$ to A$_6$ to a high level ("H") in response to the activation of the first internal test enable input signal TE1'. For example, if SW$_1$ is turned to a high level ("H"), only eight switching circuits controlled by SW$_1$, that is, only each switch (eight in total) between BUS$_8$ and I/O$_1$', between BUS$_9$ and I/O$_2$', ... and between BUS$_{15}$ and I/O$_8$' is turned on. At this time, the other switching circuits are all turned off.

Figure 9:
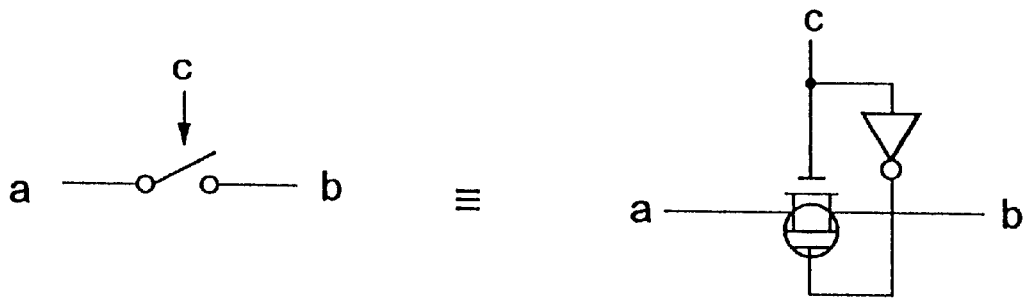
FIG. 9 is a circuit diagram showing a switching circuit shown in FIG. 1.

FIG. 9 shows the concrete circuit configuration of the switching circuits between BUS and I/O'. FIG. 9 shows the concrete circuit configuration if the input-output terminals of each switching circuit between BUS and I/O' are "a" and "b" and the control terminal to which switching signals SW$_0$ to SW$_{127}$ are supplied is "c" and as shown in FIG. 9, the switching circuits respectively function as a two-way transfer switch between a and b.

The /RAS input signal, the /CAS input signal and the /WE input signal are respectively supplied to the control signal generator 807 via the input buffer circuits 804, then the control signal generator 807 receives these signals and generates the write control signal WE', the data output activating signal DOE, the internal clock signal CLK and others.

Figure 4:
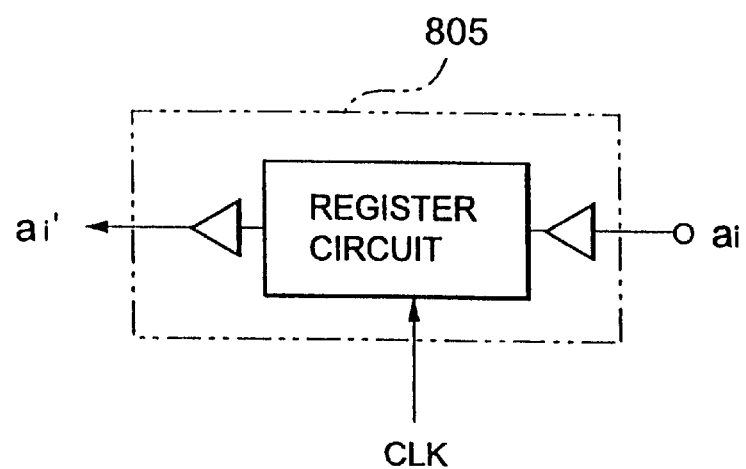
FIG. 4 is a circuit diagram showing an input buffer circuit 805 shown in FIG. 1.

The address input signals a$_0$ to a$_n$ are inputted to a decoder (its concrete circuit is omitted) provided to the memory 802 respectively via the input buffer circuits 805. Each input buffer circuit 805 has a register for holding the supplied address input signal ai in response to the clock signal CLK as shown in FIG. 4. The address input signal ai hold in the register is outputted as an internal address input signal a$_i$'.

As the memory 802 includes a memory cell array composed of 1 M words×1024 bits (total storage capacity: 1 Gbits) as described above, one word of 1 M words is selected by the address buffer signals a$_0$' to a$_n$'. Since 1 M is equivalent to 2$^{20}$, 20 address input signals are required. Therefore, the value of n in a is 19. However, if an address multiplex system adopted in general DRAM is applied, required address input signals are ten. In this case, n is 9.

Figure 5:
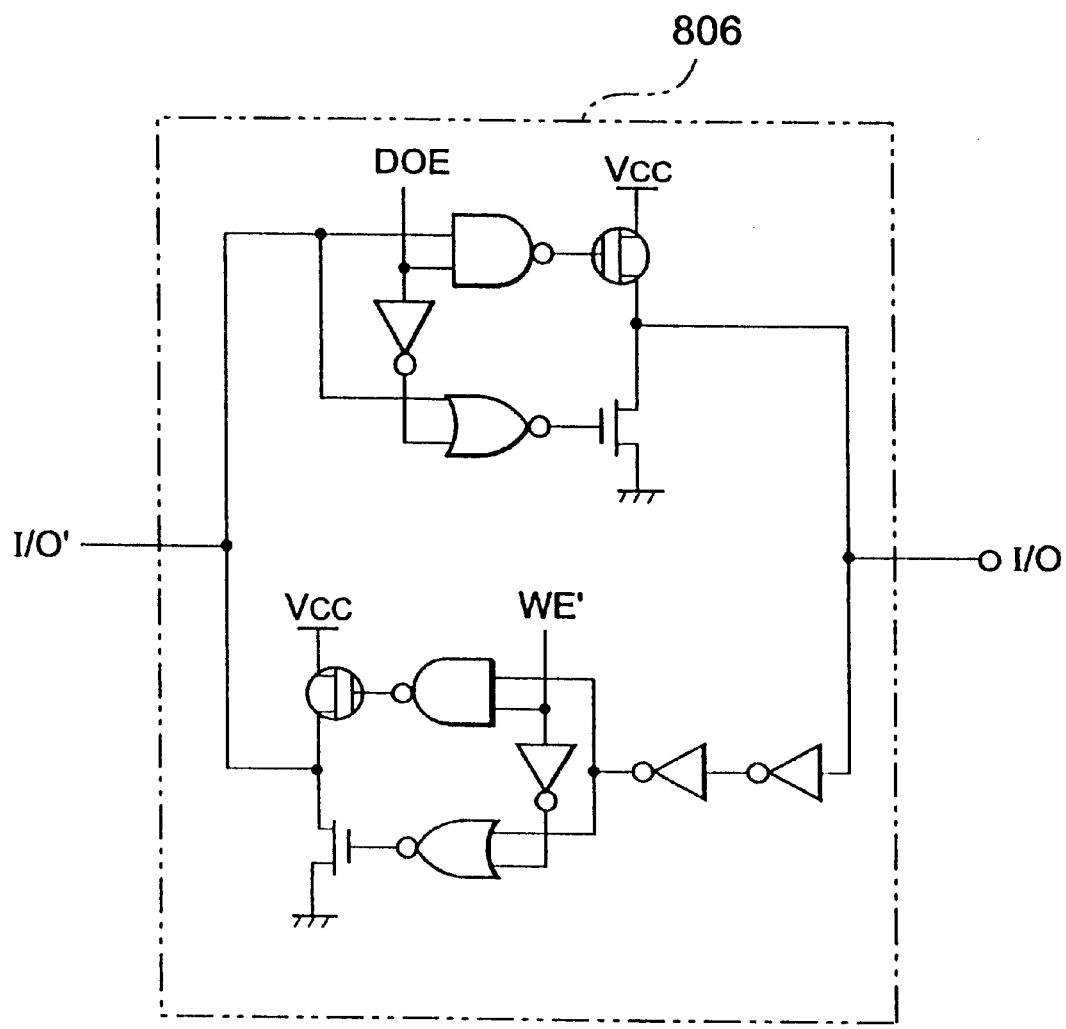
FIG. 5 is a circuit diagram showing a data input-output buffer 806 shown in FIG. 1.

The I/O buses I/O$_1$' to I/O$_8$' are respectively connected to I/O pins I/O$_1$ to I/O$_8$ via data input-output buffer 806 as shown in FIG. 5. As shown in FIG. 5, each data input-output buffer 806 has an output buffer section for receiving the data output activating signal DOE and an input buffer section for receiving the write control signal WE'. The output buffer section functions as a tristate buffer controlled by the data output activating signal DOE and the input buffer section functions as a tristate buffer controlled by the write control signal WE'.

Figure 6:
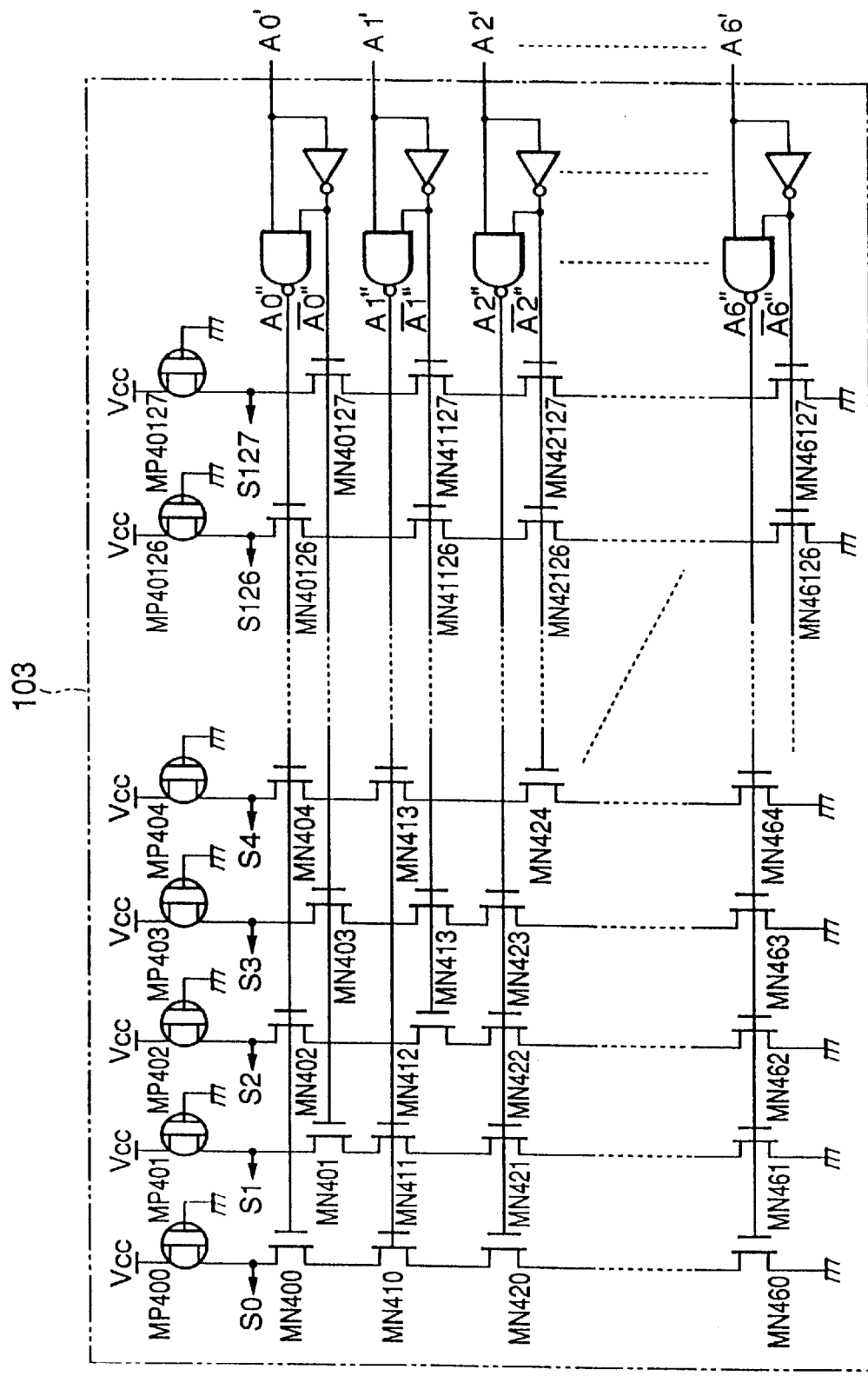
FIG. 6 is a circuit diagram showing a stripe signal generator 103 shown in FIG. 1.

Next, the stripe signal generator 103 receives block address buffer signals A$_0$' to A$_6$' generated inside the selection signal generator 803 and generates stripe signals S0 to S127 based upon these signals as shown in FIG. 6. As shown in FIG. 6, respective block address buffer signals A$_0$' to A$_6$' is supplied to a circuit composed of an inverter and a NAND gate and converted to internal block address signals A$_0$" to A$_6$". As clear in FIG. 6, if Ai' is at a high level ("H"), Ai" is also at a high level and /Ai" is at a low level ("L"), however, if Ai' is at a low level ("L"), Ai" is at a high level ("H") and /Ai" is also at a high level.

For example, if A$_0$' is at a high level and the other Ai' is at a low level, the other Ai" is at a high level and /Ai" is also at a high level though A$_0$" is at a high level and /A$_0$" is at a low level. Therefore, all N-channel metal oxide semiconductor (MOS) transistors MN410 to MN460, MN411 to MN461, ... and MN41127 to MN46127 to which block address signals A$_1$' to A$_6$' are related are turned on. In the meantime, only the group in which an internal block address signal A$_0$" is supplied to a gate of N-channel MOS transistors to which the block address signal A$_0$' is related, that is, only MOS transistors MN400, MN402, MN404, ... and MN40126 are turned on, and a group in which an internal block address signal /A$_0$" is supplied to a gate, that is, MOS transistors MN401, MN403, ... and MN40127 are all turned off. As a result, as for the levels of the stripe signals S0 to S127, S0, S2, S4, ... and S126 are turned to a low level and S1, S3, ... and S127 are turned to a high level.

The above will be described below more concretely. A$_0$" and /A$_0$" are alternately inputted to each gate electrode of N-channel MOS transistors MN400 to MN40127 as shown in FIG. 6. Therefore, as A$_0$" is at a high level ("H") and /A$_0$" is at a low level ("L"), MN400 is turned on, MN401 is turned off, MN402 is turned on, ... MN40126 is turned on and MN40127 is turned off. The ON-state resistance of a P-channel MOS transistor MP400 is designed so as to be sufficiently larger than the ON-state resistance of each series circuit of seven N-channel transistors MN400, MN410, MN420, ... and MN460. MP401, MP402 and others are also similarly designed. As for a stripe signal, S0 is at a low level ("L"), S1 is at a high level ("H"), S2 is at a low level, ..., S126 is at a low level and S127 is at a high level by designing as described above. That is, a pattern "LHLHLHLH ... LHLH" in a cycle 2 is acquired as a stripe pattern.

Similarly, if A$_1$' is at a high level and any A$_i$' (i≠1) is at a low level, A$_1$" is at a high level, /A$_1$" is at a low level, any A$_i$" (i≠1) is turned to a high level, /Ai" is turned to a high level, as a result, as for a stripe signal, S0 is turned to a low level, S1 is turned to a low level, S2 is turned to a high level, ..., S126 is turned to a high level and S127 is turned to a high level. That is, a pattern "LLHHLLHH ... LLHH" in a cycle 4 is acquired as a stripe pattern.

Similarly, as "i" in Ai" is incremented, stripe patterns in cycles 8, 16, ... are acquired and if "i" is 6, a pattern "LLLLL ... LLHH ... HHHH" (serial 64 pieces of L and serial 64 pieces of H) in a cycle 128 is acquired.

If block address buffer signals A$_0$' to A$_6$' supplied to the stripe signal generator 103 are '0000000', the stripe signals S0 to S127 are all turned to a low level.

In the stripe signal generator 103 in this embodiment, as shown in FIG. 6, an independent P-channel MOS transistor with large ON-state resistance is used in a stage in which each Si signal is generated is used, however, instead, complementary MOS (CMOS) may be also composed by providing P-channel transistors in parallel by the same number as the number of N-channel MOS transistors connected in series. In the case of CMOS, the number of elements is increased, however, there is an advantage that no pass current flows.

The stripe signals S0 to S127 generated as described above are supplied to the stripe data generator/compare circuit 101.

Next, referring to FIG. 7, the stripe data generator/compare circuit 101 will be described. The stripe data generator/compare circuit 101 receives the stripe signals S0 to S127, the write control signal WE' and the second internal test enable input signal TE2'. The stripe data generator/compare circuit 101 is activated in response to the high level of the second internal test enable input signal TE2', if the write control signal WE' is at a high level in its activated state, the stripe data generator/compare circuit functions as a stripe data generator and if the write control signal WE' is at a low level, the stripe data generator/compare circuit functions as a compare circuit.

Figure 7:
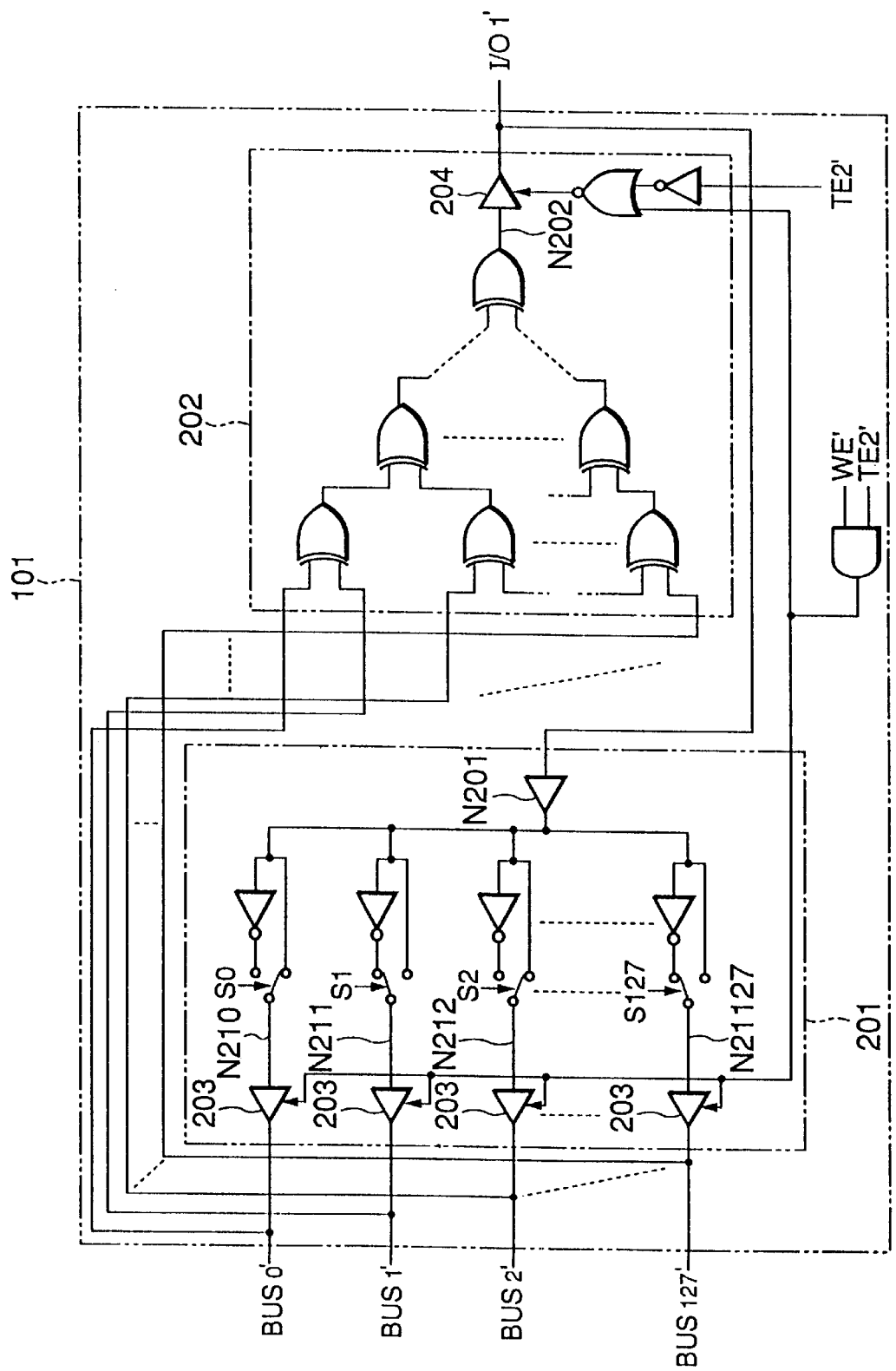
FIG. 7 is a circuit diagram showing a stripe data generator/compare circuit 101 shown in FIG. 1.

That is, as shown in FIG. 7, if the second internal test enable input signal TE2' and the write control signal WE' are both at a high level, the tristate buffer 203 is activated, hereby, the stripe data generator 201 is operated, while the data compare circuit 202 is inactivated by inactivating the tristate buffer 204. Conversely, if the second internal test enable input signal TE2' is at a high level and the write control signal WE' is at a low level, the stripe data generator 201 is inactivated and the data compare circuit 202 is activated.

FIG. 8 shows the configuration of the tristate buffers 203 and 204. FIG. 8 shows concrete circuit configuration if the input terminal of the tristate buffer is "a", the output terminal is "b" and the control terminal is "c".

Next, the functions of the stripe data generator/compare circuit 101 will be described.

Figure 10:
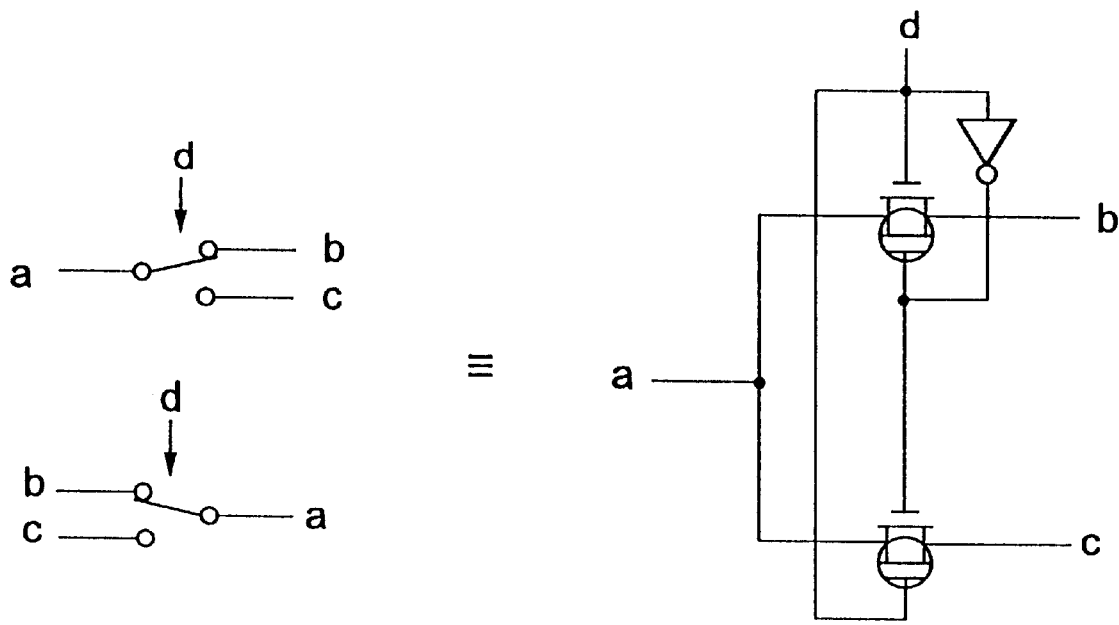
FIG. 10 is a circuit diagram showing a three-terminal switching circuit shown in FIG. 7.

First, operation in case the second internal test enable input signal TE2' is at a high level and the write control signal WE' is at a high level, that is, in case the stripe data generator 201 is activated and the data compare circuit 202 is inactivated will be described. In this case, a write data signal is transmitted from a node N201 on which a signal on an I/O bus I/O$_1$' is buffered to plural sets each of which is composed of an inverter and a switching circuit. The switching circuit used for the above set is a three-terminal type switching circuit and the concrete configuration is shown in FIG. 10. As clear in FIG. 10, the terminal a is connected to either the terminal b or the terminal c based upon the logical level of a signal supplied to a control terminal d (the stripe signals S0 to S127).

If the cycle of the stripe signal supplied to the stripe data generator 201 is 2, that is, if a stripe signal is "LHLHLH ... LHLH", a switching circuit in the stripe data generator 201 alternately repeats connection between a and b and connection between a and c. Therefore, signals on a node N210, a node N211, a node N212, ... , a node N21126 and a node N21127 are respectively in phase, out of phase, in phase, ... , in phase and out of phase with a signal on the node N201.

As a result, if I/O$_1$' is at a low level, an intermediate data bus BUS'$_0$ is turned to a low level, BUS'$_1$ is turned to a high level, BUS'$_2$ is turned to a low level, ... , BUS'$_{126}$ is turned to a low level and BUS'$_{127}$ is turned to a high level. Naturally, if I/O$_1$' is at a high level, the above respective levels are inverse.

Similarly, if the cycle of the stripe signal is 4, that is, the stripe signal is "LLHHLLHH ... LLHH" and I/O$_1$' is at a low level, BUS'$_0$, BUS'$_1$, BUS'$_2$, ... , BUS'$_{126}$ and BUS'$_{127}$ are respectively turned to a low, low, high, ... , high level and a high level. Further, in the case of cycles 8, 16, ... , 128, the above intermediate data buses are also similar.

Next, operation in case the second internal test enable input signal TE2' is at a high level and the write control signal WE' is at a low level, that is, operation in case the data compare circuit 202 is activated and the stripe data generator 201 is inactivated will be described. In this case, data on the intermediate data bus BUSi' (i=0, 1, 2, ... , 126, 127) is inputted to an exclusive-OR gate circuit and the output from these circuits is further inputted to an exclusive-OR gate circuit and the above operation is repeated. Finally, data reaches the node N202. As clear in FIG. 10, if all BUS'$_0$, to BUS'$_{127}$ are at the same level (all at a high level or all at a low level), the node N202 is turned to a low level. In the other case, that is, if all BUS'$_0$, to BUS'$_{127}$ are not at the same level, the node N202 is turned to a high level. It is proved by such operation that the data compare circuit 202 compares data.

The above each intermediate data bus BUSi' (i=0, 1, 2, ... , 126, 127) is connected to the corresponding same data generator/compare circuit 102. That is, the hybrid LSI of MPU and the memory 100 is provided with 128 same data generator/compare circuits 102. For simplification in FIG. 1, only two same data generator/compare circuits 102 are shown.

Each same data generator/compare circuit 102 is connected to the corresponding eight data buses BUS$_i$ to BUS$_{i+7}$. For example, as shown in FIG. 1, the same data generator/compare circuit 102 connected to the intermediate data bus BUS'$_0$, is connected to the data buses BUS$_0$ to BUS$_7$ and the same data generator/compare circuit 102 connected to the intermediate data bus BUS'$_{127}$ is connected to the data buses BUS$_{1016}$ to BUS$_{1023}$.

Figure 11:
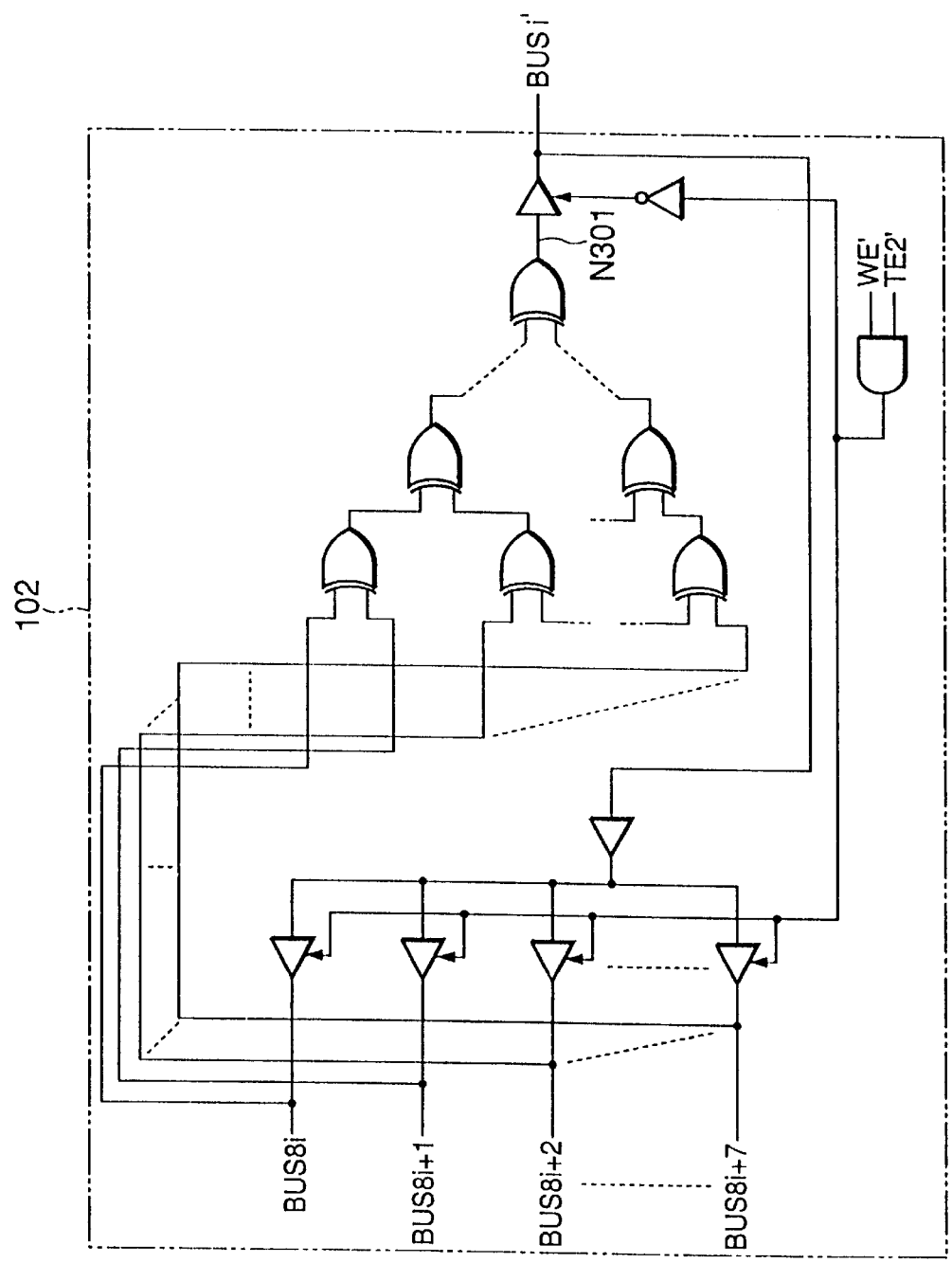
FIG. 11 is a circuit diagram showing a same data generator/compare circuit 102 shown in FIG. 1.
Figure 14:
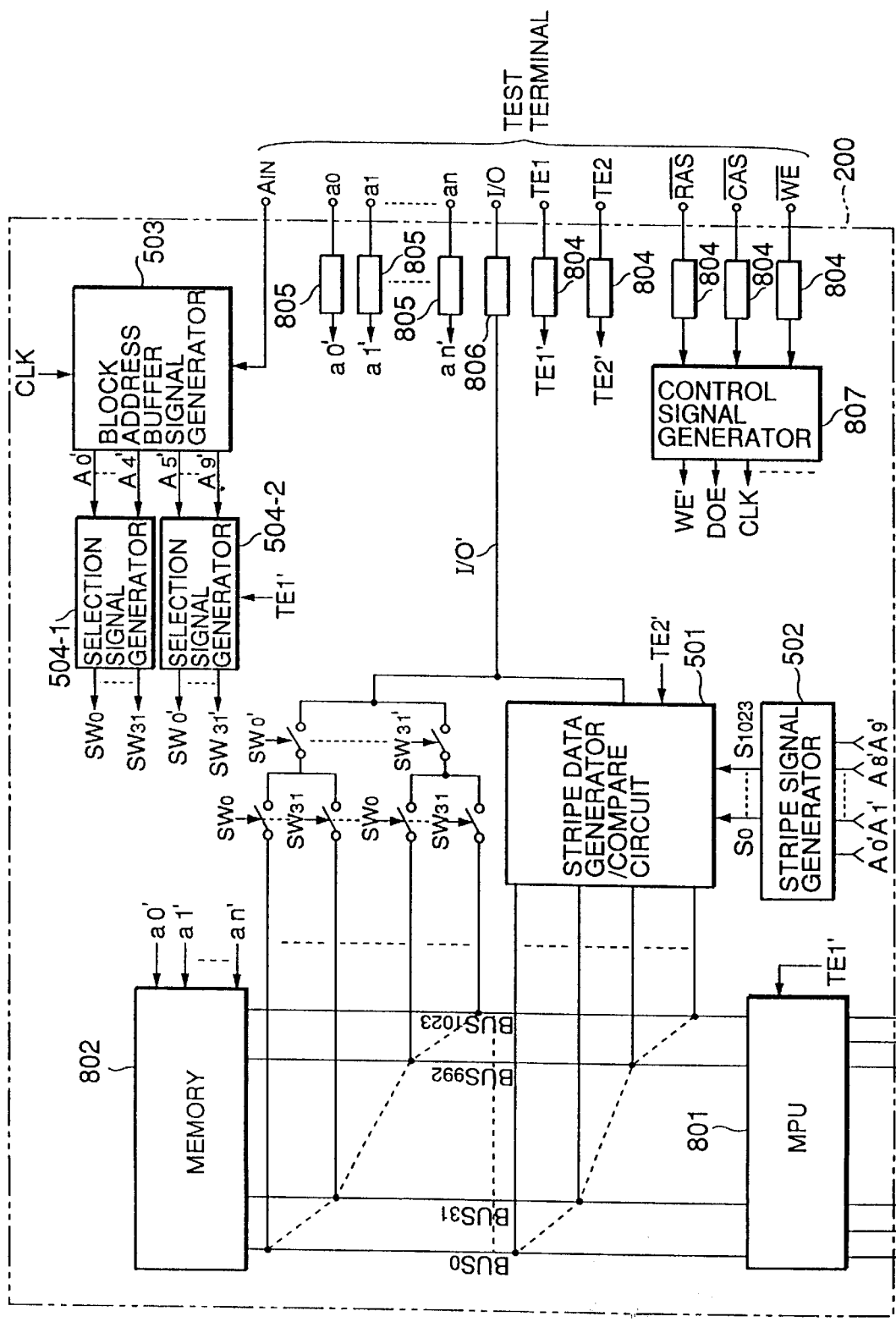
FIG. 14 is a block diagram showing hybrid LSI of MPU and a memory 200 including a memory test circuit according to another embodiment of the present invention.

FIG. 11 shows the concrete circuit configuration of each same data generator/compare circuit 102. As shown in FIG. 11, the same data generator/compare circuit 102 receives the second internal test enable input signal TE2' and the write control signal WE', when these signals are both at a high level, the same data generator/compare circuit 102 functions as a same data generator and in the other case, as a compare circuit. When the same data generator/compare circuit 102 functions as a same data generator, data on the corresponding intermediate data bus BUS is transmitted to the corresponding eight data buses. For example, the same data generator/compare circuit 102 connected to the intermediate data bus BUS'$_0$, supplies data on the intermediate data bus BUS'$_0$, to eight data buses BUS$_0$ to BUS$_7$.

In the meantime, when the same data generator/compare circuit 102 functions as a compare circuit, the above circuit receives data from the corresponding eight data buses and if the above data is at the same level (all at a high level or all at a low level) as the above data compare circuit 202, the node N301 is turned to a low level. In the other case, that is, if all data from the corresponding eight data buses is not at the same level, the node N301 is turned to a high level.

Next, the memory test operation of the hybrid LSI of MPU and the memory 100 will be described.

As described above, the memory test operation of the hybrid LSI of MPU and the memory 100 is executed in the following steps:

(1) The second test enable input signal TE2 is turned to a high level and it is judged whether a failure occurs in the memory 802 or not.

(2) If it is detected that a failure occurs in the memory 802, the second test enable input signal TE2 is kept at a high level and a block address to which the address of a defective memory cell belongs is located.

(3) When the block address to which the address of the defective memory cell belongs is located, the first test enable input signal TE1 is turned to a high level and the defective memory cell is located.

First, referring to FIG. 12, operation in the above step (1), that is, operation for turning the second test enable input signal TE2 to a high level and judging whether a failure occurs in the memory 802 or not will be described.

First, the second test enable input signal TE2 at a high level and the write control signal WE at a high level are inputted from a device except the hybrid LSI of MPU and the memory 100, and the hybrid LSI of MPU and the memory 100 is turned to a second test mode. In this state, '0000000' is supplied from an external device as the block address input signals A$_0$ to A$_6$. Hereby, internal block address input signals A$_0$" to A$_6$" and /A$_0$" to /A$_6$" are all turned to a high level and as a result, the stripe signals S0 to S127 are all turned to a low level.

In this state, a value at a low level is written to $I/O_1$ from an external device (test patterns 1 in FIGS. 12(a) to 12(c)). Then, $I/O_1'$ is turned to a low level by the data input-output buffer 806 and the stripe data generator/compare circuit 101 which functions as a stripe data generator turns all the intermediate data buses $BUS'_0$ to $BUS'_{127}$ to a low level.

In response to this, the same data generator/compare circuit 102 which functions as a same data generator turns all the corresponding data buses to a low level. Hereby, the data buses $BUS_0$ to $BUS_{1023}$ are all turned to a low level.

In this state, the address input signals $a_0$ to $a_n$ are turned from all '0' to all '1' and the value at a low level is written to all bits in all addresses.

Next, the write control signal WE is turned to a low level and data written to the memory 802 is read. That is, the address input signals $a_0$ to $a_n$ are all turned to '0' again and it is read from the I/O terminal $I/O_1$ via the same data generator/compare circuit 102 and the stripe data generator/compare circuit 101 whether any data on the data buses $BUS_0$ to $BUS_{1023}$ is the same or not.

At this time, if data on the data buses $BUS_0$ to $BUS_{1023}$ is all the same data, that is, all at a low level, data on the intermediate data buses $BUS'_0$ to $BUS'_{127}$ is also all turned to a low level by the same data generator/compare circuit 102. Therefore, the level of a signal inputted/outputted to/from the I/O terminal $I/O_1$ is also at a low level and it can be verified that no abnormality occurs (the test pattern 1 in FIG. 12(a) or 12(b)).

In the meantime, if all data on the data buses $BUS_0$ to $BUS_{1023}$ is not the same, that is, if writing the value at a low level to a certain memory cell or reading the value at a low level from a certain memory cell is not normal and read data is fixed to a high level, at least a piece of data on the intermediate data buses $BUS'_0$ to $BUS'_{127}$ is turned to a high level by the same data generator/compare circuit 102. Therefore, the level of a signal inputted/outputted to/from the I/O terminal $I/O_1$ is also turned to a high level by the stripe data generator/compare circuit 101 and it can be verified that a defective memory cell in which data is fixed to a high level out of memory cells in addresses for which the address input signals $a_0$ to $a_n$ are corresponding to all zero exists (the test pattern 1 in FIG. 12(c)).

Such reading is executed until the address input signals $a_0$ to $a_n$ are turned from all '0' to all '1'.

However, in such a test, as it can be judged only whether a defective memory cell in which data is fixed to a high level exists or not, data is written so that $I/O_1$ is turned to a high level and the similar test is executed in addition to the above test pattern 1 so as to judge whether a defective memory cell in which data is fixed to a low level exists or not (test patterns 2 in FIGS. 12(a) to 12(c)). If no defective memory cell in which data is fixed to a low level exists in such a test, the level of a signal inputted/outputted to/from the I/O terminal $I/O_1$ is a low level (the test pattern 2 in FIGS. 12(a) or (c)). In the meantime, if a defective memory cell in which data is fixed to a low level exists, the level of a signal inputted/outputted to/from the I/O terminal $I/O_1$ is a high level (the test pattern 2 in FIG. 12(b)). The above test is also executed until the address input signals $a_0$ to $a_n$ are turned from all '0' to all '1'.

It can be judged by the above test whether the memory 802 includes a defective memory cell or not.

If it is clarified by the above test that the memory 802 includes no defective memory cell, all tests are finished without proceeding to the next test. In this case, if cycle time required for writing or reading is 200 ns., total test time T is as follows:

$$T=200\times10^{-9}\times((1_{write}+1_{read})\times1048576_{WORD})\times2_{TEST\ PATTERN}\approx0.8\ (s.)$$

That is, no defective memory cell exists in the memory 802 built in the hybrid LSI of MPU and the memory 100, time required for detecting it is approximately 0.8 second.

In the meantime, if it is clarified by the above test that a defective memory cell exists in the memory 802, test patterns 3 to 9 shown in FIG. 13 are executed. That is, the above step (2) is executed.

For example, a case (FIG. 12(b)) that a defective memory cell in which data is fixed exists in the above step (1) will be described below.

As shown in FIG. 13, in the step (2), the second test enable input signal TE2 at a high level and the write control signal WE at a high level are inputted from outside the hybrid LSI of MPU and the memory 100 and the hybrid LSI of MPU and the memory 100 is turned to a second test mode. In this state, '1000000' (the test pattern 3) is supplied from an external device as block address input signals $A_0$ to $A_6$. Hereby, the stripe signals S0 to S127 are turned to "LHLHLHLHL . . . LHLH" as shown in FIG. 13.

In this state, the value at a low level is written to $I/O_1$ from an external device. Then, $I/O_1'$ is turned to a low level by the data input-output buffer 806 and the stripe data generator/compare circuit 101 which functions as a stripe data generator turns the intermediate data buses $BUS'_0$ to $BUS'_{127}$ to "LHLHLHLHL . . . LHLH".

In response to this, the same data generator/compare circuit 102 which functions as a same data generator and receives a signal at a low level from the stripe data generator/compare circuit 101 turns all the corresponding data buses to a low level and the above same data generator/compare circuit 102 which receives a signal at a high level turns all the corresponding data buses to a high level. Hereby, the data buses $BUS_0$ to $BUS_{1023}$ are turned to "LLLLLLLLHHHHHHHHLL . . . HHHH" and the above data buses are turned to a low level or a high level every eight buses.

In this state, the address input signals $a_0$ to $a_n$ are turned from all '0' to all '1', and the value at a low level is written to all bits in all addresses corresponding to data buses $BUS_0$ to $BUS_7$, $BUS_{16}$ to $BUS_{23}$, $BUS_{32}$ to $BUS_{39}$, . . . while the value at a high level is written to all bits in all addresses corresponding to data buses $BUS_8$ to $BUS_{15}$, $BUS_{24}$ to $BUS_{31}$, $BUS_{40}$ to $BUS_{47}$, . . . .

Next, the write control signal WE is turned to a low level and data written to the memory 802 is read. That is, the address input signals $a_0$ to $a_n$ are all turned to '0' again and it is read from the I/O terminal $I/O_1$ via the same data generator/compare circuit 102 and the stripe data generator/compare circuit 101 whether any data on the data buses $BUS_0$ to $BUS_{1023}$ is the same or not.

At this time, as described above, as data written to the following memory cells is at a low level even if a defective memory cell in which data is fixed to a low level exists in memory cells corresponding to the data buses $BUS_0$ to $BUS_7$, $BUS_{16}$ to $BUS_{23}$, $BUS_{32}$ to $BUS_{39}$, . . . , the defective memory cell cannot be detected. In the meantime, as data written to the following memory cells is at a high level if a defective memory cell in which data is fixed to a low level exists of memory cells corresponding to the data buses $BUS_8$ to $BUS_{15}$, $BUS_{24}$ to $BUS_{31}$, $BUS_{40}$ to $BUS_{47}$, . . . , the defective memory cell can be detected.

That is, if a defective memory cell in which data is fixed to a low level exists of memory cells corresponding to the data buses $BUS_8$ to $BUS_{15}$, $BUS_{24}$ to $BUS_{31}$, $BUS_{40}$ to $BUS_{47}$, . . . , any of the intermediate data buses $BUS'_1$, $BUS'_3$, $BUS'_5$, . . . , $BUS'_{127}$ which are the output signal conductors of the same data generator/compare circuit 102 corresponding to the above data buses is turned to a high level. Therefore, the output of the stripe data generator/compare circuit 101 is also turned to a high level.

If a defective memory cell in which data is fixed to a low level exists of memory cells corresponding to the data buses $BUS_8$ to $BUS_{15}$, $BUS_{24}$ to $BUS_{31}$, $BUS_{40}$ to $BUS_{47}$, . . . , the defective memory cell can be detected by executing the test pattern 3 shown in FIG. 13 as described above.

Similarly, test patterns 4 to 9 are subsequently executed. That is, as for the test pattern 4, '0100000' is supplied as block address input signals $A_0$ to $A_6$ and the stripe signals S0 to S127 are turned to "LLHHLLHHL . . . LLHH". As for the test pattern 5, '0010000' is supplied as block address input signals $A_0$ to $A_6$ and the stripe signals S0 to S127 are turned to "LLLLHHHHL . . . HHH$^{HH}$".

For example, in the case of the test pattern 4, as data written to the following memory cells is at a low level even if a defective memory cell in which data is fixed to a low level exists in memory cells corresponding to the data buses $BUS_0$ to $BUS_{15}$, $BUS_{47}$ to $BUS_{47}$, . . . , the defective memory cell cannot be detected. In the meantime, as data written to the following memory cells is at a high level if a defective memory cell in which data is fixed to a low level exists in memory cells corresponding to the data buses $BUS_{16}$ to $BUS_{31}$, $BUS_{48}$ to $BUS_{63}$, . . . , the defective memory cell can be detected.

When such a test is executed till the test pattern 9, it can be located in a block address corresponding to which data bus of the data buses $BUS_0$ to $BUS_{1023}$ a defective memory cell is included.

FIG. 13 shows a case that a failure is detected using the test patterns 3 and 5. In case a failure is detected using the test patterns 3 and 5 as described above, it can be verified that a defective memory cell is included in a block address corresponding to a data bus with an address of '1010000' acquired by adding block addresses '1000000' and '0010000' corresponding to these test patterns 3 and 5, that is, in a block address corresponding to the data buses $BUS_{40}$ to $BUS_{47}$.

In the above example, a case (FIG. 12(b)) that a defective memory cell in which data is fixed to a low level exists in the above step (1) is described, however, if a defective memory cell in which data is fixed to a high level exists in the above step (1)(FIG. 12(c)), the value at a high level has only to be written to $I/O_1$ from an external device in the above step (2). In this case, the logical level of data supplied to the data buses $BUS_0$ to $BUS_{1023}$ is reverse to the logical level in the above case and it can be located in a block address corresponding to which data bus a defective memory cell in which data is fixed to a high level is included.

It is clear from the above description that it is judged by executing the test patterns 1 and 2 whether a failure occurs in the memory 802 or not and a block address to which the address of a defective memory cell belongs can be located by subsequently executing the test patterns 3 to 9 if the failure is found hereby.

If a block address to which the address oaf defective memory cell belongs is located by executing the test patterns 1 to 9, the first test enable input signal TE1 is turned to a high level in the step (3) finally and the address of the defective memory cell is located.

That is, if a full test is executed only for a block to which the address of the defective memory cell belongs, the defective memory cell can be located. For example, in the above example, as it is verified that a failure occurs in a block related to the intermediate data bus $BUS'_5$, a full test has only to be executed only for a block including the failure in the step (3).

Concretely, the second test enable signal TE2 is inactivated (turned to a low level), the first test enable signal TE1 is activated (turned to a high level) and a group of block address signals inputted to the circuit 803 $A_0$ to $A_6$ is set to '1010000'. Hereby, $SW_5$ is turned to a high level and the other SWi is all turned to a low level. At this time, the respective switches between $BUS_{40}$ and $I/O'_1$, between $BUS_{41}$ and $I/O'_2$, between $BUS_{42}$ and $I/O'_3$, . . . , between $BUS_{47}$ and $I/O'_8$ are turned on and the data buses $BUS_{40}$ to $BUS_{47}$ and the I/O terminals $I/O_1$ to $I/O_8$ are respectively connected. In this state, a defective memory cell and others can be located by executing a full test for memory cells which belong to the data buses $BUS_{40}$ to $BUS_{47}$ until the address input signals $a_0$ to $a_9$ are turned from all '0' to all '1'.

The above full test means a test, as with the test executed in the hybrid LSI of MPU and the memory 400, in which each input signal $a_0$ to $a_n$ is sequentially supplied from all '0' to all '1' in a state in which /RAS, /CAS and /WE are supplied at predetermined timing and hereby, a predetermined test pattern is sequentially provided to $I/O_1$ to $I/O_8$, sequentially accessing to the corresponding eight memory cells.

The test pattern is as follows:

(1) Data '0' is sequentially written to a block address including the address of a defective memory cell.

(2) Next, after data '0' written to the memory cell is read, data '1' is written to the same memory cell. The operation is sequentially executed for a block address including the address of a defective memory cell.

(3) Next, after data '1' written to the memory cell is read, data '0' is written to the same memory cell. The operation is sequentially executed for a block address including the address of a defective memory cell.

(4) Finally, data '0' written to the memory cell is sequentially read. Hereby, a full test in a block address area including the address of a defective memory cell is completed. As writing is executed once in above (1), reading and writing are executed once each in above (2) and (3) and reading is executed once in above (4), writing and reading are executed for each memory cell three times each in total.

Test time T required for executing a series of tests is as follows:

$$T = 200 \times 10^{-9} \times ((1_{write} + 1_{read}) \times 1048576_{WORD}) \times 9_{TEST\ PATTERN} + 200$$
$$ns. \times 10^{-9} \times ((3_{write} + 3_{read}) \times 1048576_{WORD}) \times 1_{BLOCK\ ADDRESS} \approx 5\ (s.)$$

As described above, in the hybrid LSI of MPU and the memory 100, the test time T of the memory 802 is approximately 5 seconds and when the test time is compared with approximately 161 seconds which is the test time of the above hybrid LSI of MPU and the memory 400, it is clear that the test time is remarkably reduced.

That is, if no defective memory cell exists, the test is finished in approximately 0.8 second as described above and even if a defective memory cell exists, only approximately 5 seconds are required for locating the defective memory cell.

As described above, the memory test circuit in this embodiment can locate a defective location in extremely short time by using the stripe data generator/compare circuit 101, the same data generator/compare circuit 102 and the stripe signal generator 103.

Next, referring to FIGS. 14 to 17, hybrid LSI of MPU and a memory 200 including a memory test circuit according to another embodiment of the present invention will be described.

In the hybrid LSI of MPU and the memory 200 in this embodiment, the same data generator/compare circuit 102 is removed from the above hybrid LSI of MPU and the memory 100, the stripe data generator/compare circuit 101 is replaced with a stripe data generator/compare circuit 501 and a block address buffer signal generator 503 is added. The number of terminals for a memory test is rather reduced owing to the above alterations, compared with that in the hybrid LSI of MPU and the memory 100. Concretely, eight data input-output terminals are reduced to one and seven block address input terminals are reduced to one.

Figure 16:
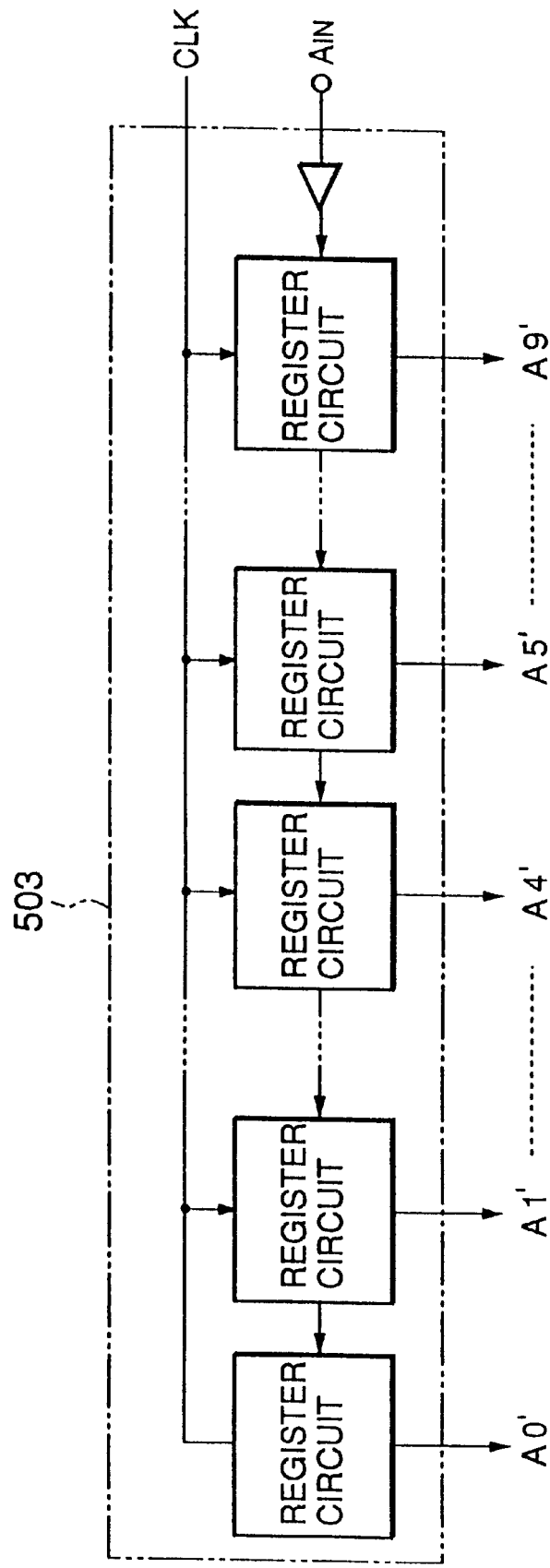
FIG. 16 is a circuit diagram showing a block address buffer signal generator 503 shown in FIG. 14.

Next, the configuration of the hybrid LSI of MPU and the memory 200 including the memory test circuit according to this embodiment and operation in the memory test will be described. First, as shown in FIG. 16, desired block address information can be serially inputted to a block address input signal $A_{IN}$. For example, the information of '1010000000' is serially inputted to $A_{IN}$ in the order. Each information is sequentially inputted every cycle of a /RAS signal. In a circuit 807, a clock signal CLK is generated at the timing of a trailing edge of the /RAS signal (a concrete circuit diagram is omitted). As shown in FIG. 16, information in a register circuit is sequentially shifted from the right to the left owing to the clock signal CLK. That is, shift register operation is executed. Therefore, when '1010000000' is all inputted to $A_{IN}$, the information of '1010000000' is stored from the left in each register in the block address buffer signal generator 503. That is, at this time, the block address information $A_0$ to $A_9$ is stored. The block address information $A_0$ to $A_9$ stored as described above can be extracted from the block address buffer signal generator 503 as block address buffer signals $A_0'$ to $A_9'$.

Block address signals $A'_0$ to $A'_4$ of block address signals $A'_0$ to $A'_9$ outputted from the block address buffer signal generator 503 are supplied to a selection signal generator 504-1, and block address signals $A'_5$ to $A'_9$ are supplied to a selection signal generator 504-2. The selection signal generator 504-1 receives the block address signals $A'_0$ to $A'_4$, decodes them, and generates switching signals SW0 to SW31, while the selection signal generator 504-2 receives the block address signals $A'_5$ to $A'_9$, decodes them and generates switching signals SW'0 to SW'31.

As described above, in this embodiment, only one block address input signal terminal is required by using the block address buffer signal generator 503.

Next, the stripe signal generator 502 composed of an inverter and a NAND gate in this embodiment converts respective block address buffer signals $A_0'$ to $A_9'$ to internal block address signals $A_0''$ to $A_9''$ and $/A_0''$ to $/A_9''$ and generates stripe signals S0, S1, S2, ..., S1022, S1023 as the stripe signal generator 103 in the hybrid LSI of MPU and the memory 100.

Figure 15:
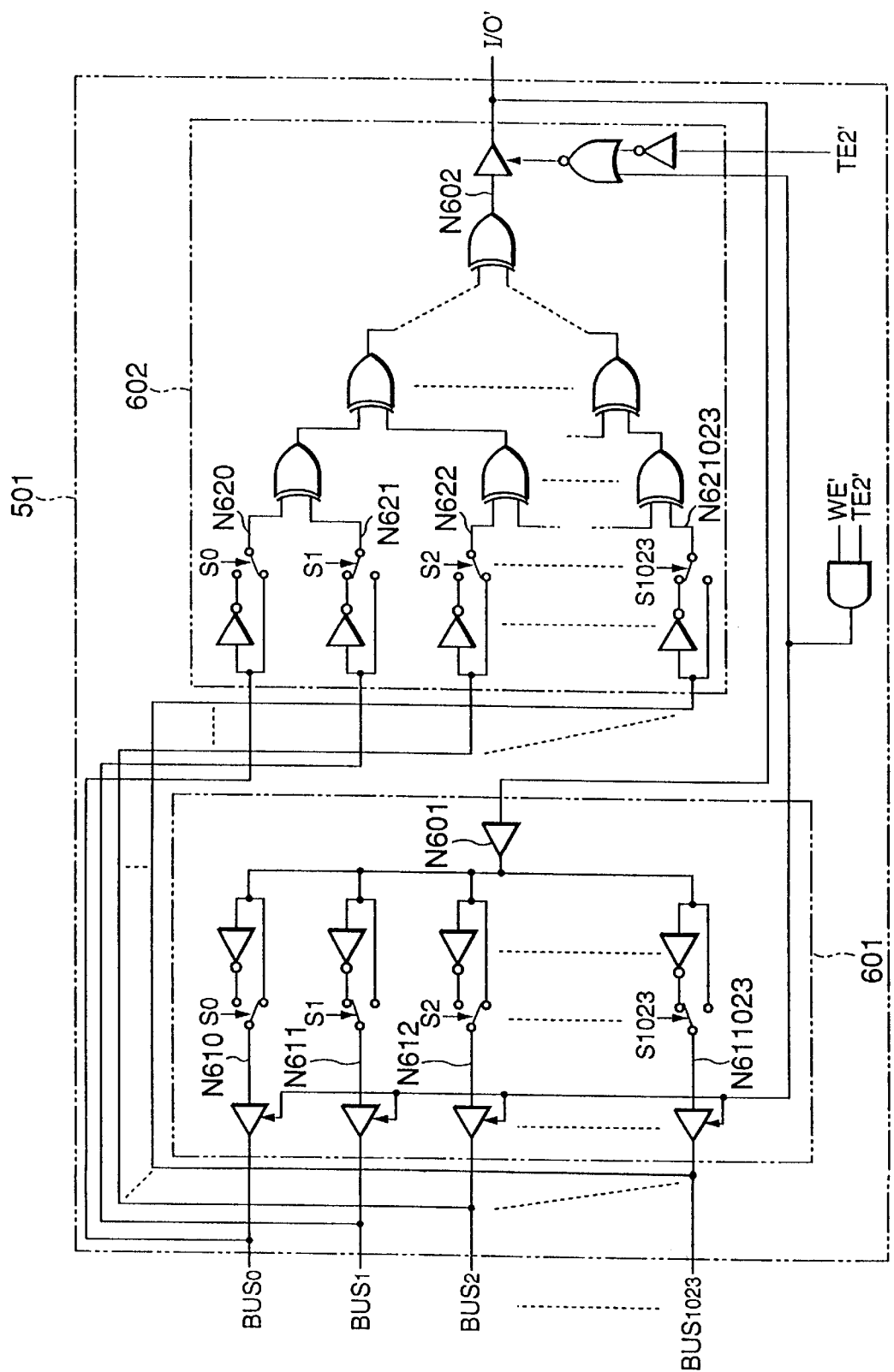
FIG. 15 is a circuit diagram showing a stripe data generator/compare circuit 501 shown in FIG. 14.

As shown in FIG. 15, the stripe data generator/compare circuit 501 receives stripe signals S0 to S1023, a write control signal WE' and a second test enable input signal TE2'. The stripe data generator/compare circuit 501 is activated in response to a high level of the second test enable input signal TE2', when the write control signal WE' is at a high level in an activated state, the stripe data generator/compare circuit 501 functions as a stripe data generator, and when the write control signal WE' is at a low level, the stripe data generator/compare circuit 501 functions as a stripe data compare circuit.

That is, if the second test enable input signal TE2' is at a high level and the write control signal WE' is at a high level, the stripe data generator 601 is activated and the stripe data compare circuit 602 is inactivated. In the meantime, if the second test enable input signal TE2' is at a high level and the write control signal WE' is at a low level, the stripe data compare circuit 202 is activated and the stripe data generator 201 is inactivated.

First, if the second test enable input signal TE2' is at a high level and the write control signal WE' is at a high level, a buffered signal on a node N601 is transmitted to plural sets composed of an inverter and a switching circuit. As for operation, the stripe data generator/compare circuit 501 is similar to the stripe data generator/compare circuit 101, however, the stripe data generator/compare circuit 501 is different from the stripe data generator/compare circuit 101 in that the output of the stripe data generator 601 is not supplied to intermediate data buses but directly supplied to data buses $BUS_0$, $BUS_1$, $BUS_2$, ..., $BUS_{1022}$ and $BUS_{1023}$.

Next, a case that TE2 is at a high level and WE' is at a low level will be described. In this case, a read data signal is transmitted to plural sets composed of an inverter and a switching circuit via data buses BUSi (i=0, 1, 2, ..., 1022, 1023). The read data signal is inputted to exclusive OR gate circuit via nodes N620, N621, N622, ..., N621022 and N621023 after each set composed of an inverter and a switching circuit, further, output from each exclusive OR gate is inputted to an exclusive OR gate and the above operation is repeated. Finally, the read data signal reaches a node N602. As clear from FIG. 15, if all nodes from N620 to N621023 are at the same level (all at a high level or all at a low level), the node N602 is always at a low level. However, if only one of from the node N620 to the node N621023 is at a level different from the level of others, the node N602 is at a high level. That is, the circuit 602 compares data (level).

Next, the writing/reading operation of the stripe data generator/compare circuit 501 will be described. As an example, a case that stripe data is in a cycle 2 will be described. First, in a state in which writing is on (TE2 is at a high level and WE' is at a high level), a value at a low level is written to I/O. Then, I/O' is turned to a low level by a data input-output buffer 806 and as described above, $BUS_0$ is turned to a low level, $BUS_1$ is turned to a high level, $BUS_2$ is turned to a low level, ... $BUS_{1022}$ is turned to a low level and $BUS_{1023}$ is turned to a high level by the circuit 601. Therefore, data on these data buses is written to memory cells in the memory 802. In this state, writing operation to all memory cells is executed by sequentially inputting a set of address input signals from the least significant ($a_0$ to $a_n$: all at a low level) to the most significant ($a_0$ to $a_n$: all at a high level) and writing data.

After writing operation, reading is turned on (TE2 is at a high level and WE' is at a low level) and reading operation is executed. In the case of a stripe pattern in the above cycle 2, the level when level is read from a memory cell to a data bus is the same as that in writing, $BUS_0$ is at a low level, $BUS_1$ is at a high level, $BUS_2$ is at a low level, ..., $BUS_{1022}$ is at a low level and $BUS_{1023}$ is at a high level. As the cycle of the stripe pattern is 2, a stripe signal Si is at a low level if "i" is even and is at a high level if "i" is odd. Therefore, the level on each data bus is converted by each set composed of an inverter and a switching circuit of the circuit 602, and the each level on 1024 nodes N620 to N621023 is all at a low level. Therefore, the node N602 which is the output of a tree of the exclusive OR gates is turned to a low level, and I/O' is turned to a low level and I/O is turned to a low level. As described above, if written data and read data are the same, the output of the stripe data generator/compare circuit 501 is at a low level.

The above operation is similar for stripe data in cycles 4, 8, . . . .

Next, referring to FIG. 17, a case that a block in the memory 802 is defective will be described. As a specific example, it is supposed that an at least 1-bit memory cell is fixed to a low level in a memory block connected to a data bus $BUS_5$. In this case, when a pattern for turning $BUS_5$ to a high level is written, $BUS_5$ is still at a low level upon reading. Therefore, a node N625 (though it is not shown, it is a node after a set composed of an inverter and a switching circuit and controlled by S5) in the circuit 602 is turned to a high level acquired by inverting a low level by an inverter because S5 is at a high level. In the meantime, the other 1023 nodes N620 to N624 and N626 to N621023 are all at a low level by each set composed of an inverter and a switching circuit. Therefore, the output 602 of the tree of the exclusive OR gates is at a high level. That is, I/O' is at a high level and I/O is at a high level.

The memory test of the hybrid LSI of MPU and the memory 200 is also executed as the memory test of the hybrid LSI of MPU and the memory 100. That is, the test is executed in the following three steps:

(1) The second test enable input signal TE2 is turned to a high level and it is judged whether a failure occurs in the memory 802 or not.

(2) If it is detected that a failure occurs in the memory 802, a block address to which the address of a defective memory cell belongs is located.

(3) When the block address to which the address of the defective memory cell belongs is located, the first test enable input signal TE1 is turned to a high level and the address of the defective memory cell is located.

The failure in which the memory cell is fixed to a high level is tested (a test pattern 1) by the above step (1), that is, by reading a value at a low level after the value is written to all memory cells, and as for a step in which a failure in which the memory cell is fixed to a low level is detected (a test pattern 2) by reading a value at a high level after the value is written to all the memory cells next, a test is similar to the test of the hybrid LSI of MPU and the memory 100.

Therefore, if it is proved by such a test that no defective memory cell exists in the memory 802, the test is finished.

In the meantime, if it is proved by the above test that a defective memory cell exists in the memory 802, test patterns 3 to 12 shown in FIG. 17 are executed. That is, stripe patterns in the cycles 2, 4, 8, . . . , 1024 are generated by the stripe signal generator 502 by serially inputting block addresses $A_0$ to $A_9$ via $A_{IN}$ from an external tester, and when a test is executed in each case, it can be detected as in the hybrid LSI of MPU and the memory 100 that a memory cell related to $BUS_5$ is defective as shown in FIG. 17.

That is, it can be judged whether a failure occurs or not and if the failure occurs, a defective block can be located by executing a test according to 12 test patterns. If a full test is further executed only for a defective block in case a failure occurs, a defective location such as a defective memory cell can be located. As it is verified in the above example that a failure occurs in a block related to the data bus $BUS_5$, a full test has only to be executed only for a defective block afterward.

Concretely, the second test enable input signal TE2 is inactivated (turned to a low level), the first test enable input signal TE1 is activated (turned to a high level) and block address information '1010000000' for $A_0$ to $A_9$ is serially inputted to the input terminal $A_{IN}$ of the circuit 503. Hereby, SW5 is turned to a high level and the other SWi is all turned to a low level by a selection signal generator 504-1. Similarly, SW'0 is turned to a high level and the other SW'i is all turned to a low level by inputting '00000' to $A_5$ to $A_9$. Hereby, two switches in series between $BUS_5$ and I/O' are both turned on and the data bus $BUS_5$ and the I/O terminal I/O are connected. A defective location such as a defective memory cell can be located by executing a full test in this state.

Test time T required for executing the above series of test is as follows:

$$T=200\times10^{-9}\times((1_{write}+1_{read})\times1048576_{WORD})\times12_{TEST\ PATTERN}+200\ ns.\times10^{-9}\times((3_{write}+3_{read})\times1048576_{WORD})\times1_{BLOCK\ ADDRESS}=6.3\ (s.)$$

As described above, in the hybrid LSI of MPU and the memory 200 in this embodiment, test time T required for a memory test is approximately 6.3 second and is remarkably reduced, compared with approximately 161 seconds which is the memory test time of the hybrid LSI of MPU and the memory 400. In addition, there is an advantage that the number of terminals for a memory test is greatly reduced, compared with that in the hybrid LSI of MPU and the memory 100.

Figure 18:
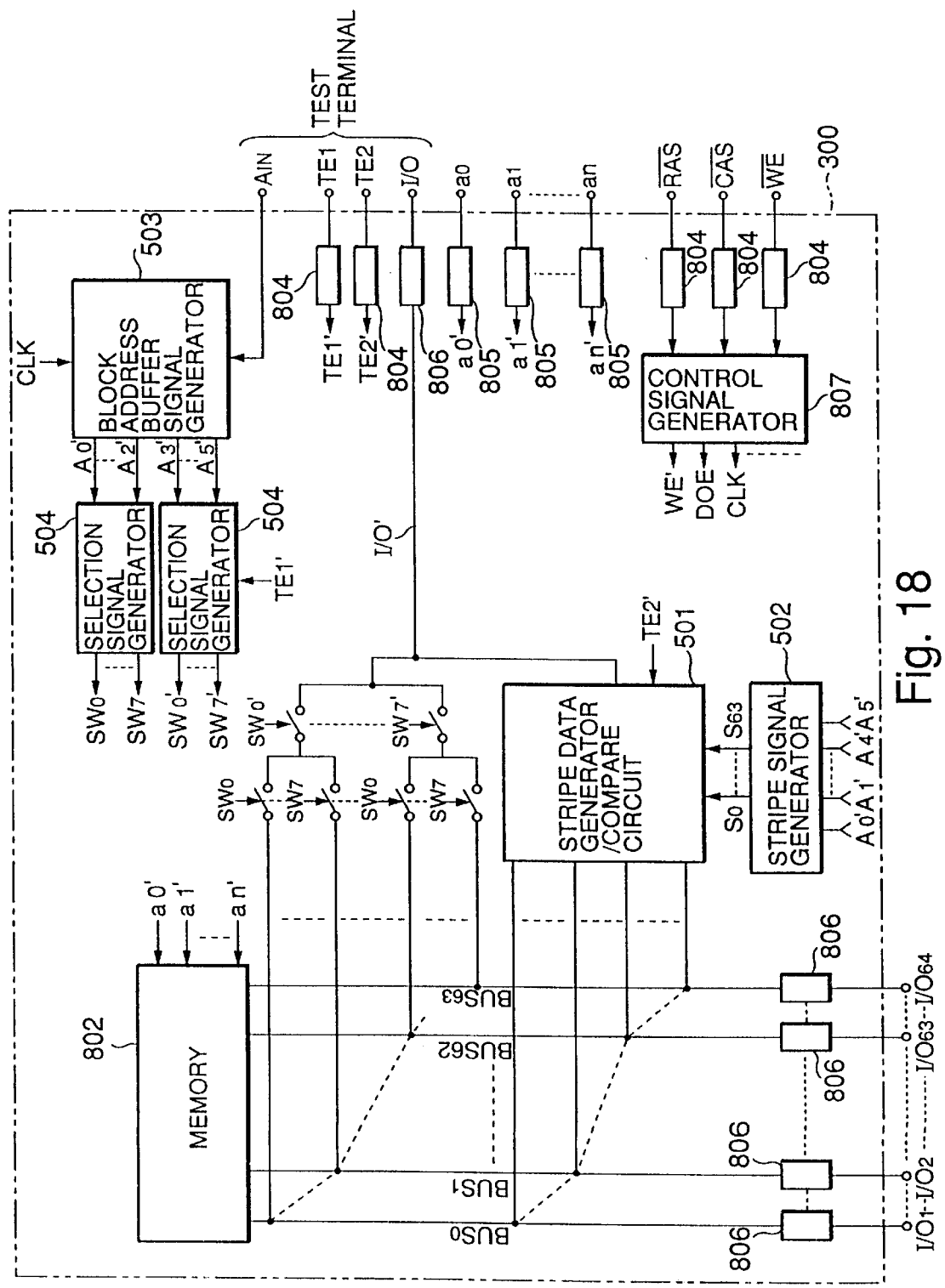
FIG. 18 is a block diagram showing memory LSI 300 including the memory test circuit according to another embodiment of the present invention.

The memory test circuit according to the present invention can be also mounted not only on the hybrid LSI of MPU and the memory but on normal memory LSI. FIG. 18 shows an example in which the above memory test circuit is mounted on memory LSI 300.

That is, the memory LSI 300 is not the hybrid LSI of MPU and the memory but a normal DRAM chip for example and provided with 64 data input-output terminals.

As the operation of the memory test circuit is the same as that of the above hybrid LSI of MPU and the memory 200, the description is omitted. In this embodiment, as address input signals $a_0$ to $a_n$, /RAS, /CAS and /WE are also used in a normal operating mode, terminals used only for the memory test are only four terminals $A_{IN}$, TE1, TE2 and I/O.

A case is estimated in which it is difficult to measure multiple memory LSIs in parallel because of the functional restriction of a tester in memory LSI provided with 64 data input-output terminals ($I/O_1$ to $I/O_{64}$) such as the memory LSI 300. In such a case, measurement in parallel can be readily executed by using the memory test circuit according to the present invention. Even in the case of an easier tester which cannot process 64 data input-output signals, the memory test circuit according to the present invention is also effective.

As described above, according to the present invention, the test time of LSI including a memory, particularly a memory built in the hybrid LSI of MPU and the memory can be remarkably reduced.

Further, according to the present invention, the number of dedicated terminals for such a test can be reduced.

Furthermore, when a memory test is executed using the memory test circuit according to the present invention, a complicated tester is not required.

As for the memory 802 in the above embodiments, mainly a dynamic RAM (DRAM) type of memory cell array is supposed, however, a memory cell array may be also a static RAM (SRAM) type. It is matter of course that various applied examples which meet the present invention may be assumed without limiting to the above embodiments.

What is claimed is:

1. A memory test circuit for detecting a failure of a semiconductor memory device including a plurality of memory cells addressed by address input signals, comprising a stripe data generator generating a stripe data and writing it to said memory cells selected by address input signals, said stripe data being made from a part of said address input signals; and a compare circuit comparing data read from said memory cells and said stripe data.

2. The memory test circuit as claimed in claim 1, wherein said stripe data generator generates a first stripe data, in which one logic level and another logic level are alternately repeated when said part of said address input signals shows a first address information, and said second stripe data, in which the one logic level successively occurring and the other logic level successively occurring are alternately repeated when said part of said address input signals shows a second address information.

3. The memory test circuit as claimed in claim 2, wherein said stripe data generator further generating all "0" data when said part of said address input signals shows a third address information and writing said all "0" data to said memory cells, and said compare circuit further comparing data read from said memory cells and said all "0" data.

4. A semiconductor integrated circuit, comprising:

a memory portion including a plurality of memory cells;

a MPU portion;

bus lines connecting said memory portion and said MPU portion;

a stripe data generator supplying a stripe data to said bus lines to write said stripe data to said memory cells selected by address signals, and stripe data being made from a part of said address input signals; and a compare circuit comparing data on said bus lines read from said memory cells and said stripe data.

5. A method for detecting a failure of a semiconductor memory device having a plurality of blocks, each of which includes a plurality of memory cells and a block to be selected is determined by a block selection address signal, comprising:

generating test pattern data based upon said block selection address signal;

judging whether said semiconductor memory device has defective memory cell or not and detecting a block having said defective memory cell in said plurality of blocks by use of said test pattern data; and finding out where said defective memory cell is.

6. The method as claimed in claim 5, wherein said judging comprises writing a data composed of one logic level to said memory cells, and comparing said data and a data read from said memory cells.

7. The method as claimed in claim 5, wherein said detecting comprises writing a data composed of one logic level and the other logic level to said memory cells, and comparing said data and a data read from said memory cells.

8. A memory test circuit for detecting failure of a semiconductor memory device including a plurality of memory cells, said memory cell being coupled to data buses for inputting and outputting data to and from said memory cells, comprising:

a signal generator generating n signal patterns, each signal pattern being repeating series of consecutive bits of one logic level followed by an equal number of consecutive bits of an opposite logic level, where the number of consecutive bits in each signal pattern changes according to $2^i$ where $0 \leq i \leq n-1$, each signal pattern comprising $2^n$ bits, a data generator responsive to said signal patterns and to an input data signal for producing test data patterns to said data buses, said test data patterns comprising a plurality of bits each of said one logic level or said opposite logic level in accordance with the coincidence of said input data signal and the bits of said signal patterns, said bits of said test patterns being stored in memory cells of said semiconductor memory device, and a compare circuit for comparing the bits read from said memory cells with the test data patterns.

9. A memory test circuit as claimed in claim 8 wherein said plurality of memory cells of said semiconductor memory device is arranged in blocks of memory cells, each block being designated by a block address and wherein said signal generator is responsive to bits of a block address to generate n signal patterns, said memory test circuit further comprising:

a plurality of block data generators each responsive to a bit of a test pattern to reproduce the bit of the test pattern a number of times equal to the number of data buses in a block, the outputs of each block data generator being coupled to a respective one of the data buses of a respective block.

10. A memory test circuit as claimed in claim 9, further including a plurality of block compare circuits one associated with each block, said block compare circuits being coupled between the data buses of a respective block and said compare circuit for determining a block producing an error.

11. A memory test circuit as claimed in claim 10 further including;

first and second test signal generators for producing first and second test signals, said data generator being responsive to one of said test signals to produce said test patterns, and a test circuit responsive to said other test signal for testing the memory cells of a block producing an error to determine the memory cell with the block producing the error.

12. A memory test circuit as claimed in claim 8 further including:

first and second test signal generators for producing first and second test signals, said data generator being responsive to one of said test signals to produce said test patterns.

13. A memory test circuit for detecting failure of a semiconductor memory device including a plurality of memory cells, said memory cells being coupled to data buses for inputting and outputting data to and from said memory cells, comprising:

a test generator producing a plurality of test patterns, each test pattern comprising a plurality of bits of one logic level and a plurality of bits of an apposite logic level, one test pattern being divided into two sets of consecutive bits, a first set of consecutive bits being of said one logic level, the second set of consecutive bits being of an equal number of bits to that of said first set and of said opposite logic level, and a plurality of additional test patterns each dividing the sets of consecutive of the same logic level of a contiguous test pattern into two sets of bits, each set of bits containing a number of consecutive bits of said one logic level and an equal number of bits of said opposite logic level.

14. A memory test circuit as claimed in claim 13 further including:
- means for applying said test patterns to said data buses for writing into memory cells associated with said data buses, and
- a compare circuit for comparing data signals read from said data buses to said test patterns.

15. A memory test circuit as claimed in claim 13 wherein said test pattern generator produces a number of test patterns having a number of bits equal in number to the number of data buses.

16. A memory test circuit as claimed in claim 13 wherein said memory cells of said semiconductor memory device are arranged in blocks, said test pattern generator producing a number of test patterns each having a number of bits equal in number to the number of memory cell blocks.

17. A memory test circuit as claimed in claim 16 further including
- a plurality of block test pattern generators each responsive to a bit of a test pattern to reproduce the bit of the test pattern a number of times equal to the number of data buses in a block, the outputs of each block data generator being coupled to a respective one of the data buses of a respective block, and
- a plurality of block compare circuits each one associated with one block, said block compare circuits being coupled between the data buses of a respective block for determining a block producing an error.

18. A memory test circuit as claimed in claim 17 further including a compare circuit coupled to said block compare circuits for outputting an indication of a block containing an error.

* * * * *